(12) United States Patent
Lin

(10) Patent No.: US 12,745,613 B2
(45) Date of Patent: Sep. 22, 2026

(54) FORMING ISOLATION REGIONS WITH LOW PARASITIC CAPACITANCE AND REDUCED DAMAGE

(71) Applicant: Taiwan Semiconductor Manufacturing Co., Ltd., Hsinchu (TW)

(72) Inventor: Tzu-Ging Lin, Kaohsiung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 408 days.

(21) Appl. No.: 18/408,205

(22) Filed: Jan. 9, 2024

(65) Prior Publication Data

US 2025/0132191 A1 Apr. 24, 2025

Related U.S. Application Data

(60) Provisional application No. 63/591,951, filed on Oct. 20, 2023.

(51) Int. Cl.

| | |
|---|---|
| ***H10W 10/00*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(Continued)

(52) U.S. Cl.
CPC ........ *H10W 10/014* (2026.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/83* (2025.01); *H10W 10/17* (2026.01)

(58) Field of Classification Search
CPC .. H10W 10/014; H10W 10/17; H10D 30/014; H10D 30/43; H10D 30/6735; H10D 30/6757; H10D 62/121; H10D 64/017; H10D 84/83; H10D 84/0135; H10D 84/0151; H10D 84/038
See application file for complete search history.

(56) References Cited

U.S. PATENT DOCUMENTS

| | | | | |
|---|---|---|---|---|
| 11,437,277 B2 * | 9/2022 | Ko | H10D 84/0158 | |
| 2021/0098466 A1 * | 4/2021 | Liaw | H10D 89/10 | |
| 2023/0137528 A1 * | 5/2023 | Wu | H10B 10/12 | 257/288 |

* cited by examiner

*Primary Examiner* — Fernando L Toledo
*Assistant Examiner* — Shawn Shaw Muslim
(74) *Attorney, Agent, or Firm* — Slater Matsil, LLP

(57) ABSTRACT

A method includes forming a plurality of semiconductor regions, forming a plurality of gate stacks, wherein the plurality of gate stacks are on first portions of the plurality of semiconductor regions, and etching the plurality of gate stacks to form a plurality of openings in the plurality of gate stacks. The plurality of openings include a first opening in a first gate stack, and a second opening in a second gate stack. The first opening and the second opening are immediately neighboring each other and have an overlap with an overlap distance equal to or greater than a pitch of the plurality of semiconductor regions. The plurality of semiconductor regions are etched to extend the plurality of openings downwardly to be between dielectric isolation regions, followed by filling the plurality of openings to form fin isolation regions. The gate isolation regions are spaced apart from the fin isolation regions.

20 Claims, 37 Drawing Sheets

(51) Int. Cl.
*H10D 84/83* (2025.01)
*H10W 10/17* (2026.01)

30/34
48
110
112
38
22'/28/20'
X
Y 126
38
38
52
22B
70
62
68
62
20
48
48
48
48
48
52

126
70
22B
22B
68
62
26
20
20'
20'
20'
20'
26
26
26
26

FORMING ISOLATION REGIONS WITH LOW PARASITIC CAPACITANCE AND REDUCED DAMAGE

PRIORITY CLAIM AND CROSS-REFERENCE

This application claims the benefit of the following provisionally filed U.S. patent application: Application No. 63/591,951, filed on Oct. 20, 2023, and entitled "STRATEGY OF THE METAL GATE PATTERNING ON THE LINE END OF CPODE IN THE SCALING LIMIT," which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Gate-All-Around (GAA) Transistors have been introduced to replace planar transistors. The structures of the GAA transistors and methods of fabricating the GAA transistors are being developed.

The formation of the GAA transistors typically includes forming long strips (including alternating semiconductor materials) and long gate stacks, and then forming isolation regions to cut the long strips and long gate stacks into shorter portions. The shorter portions may be used to form the channel layers and the gate stacks of the GAA transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
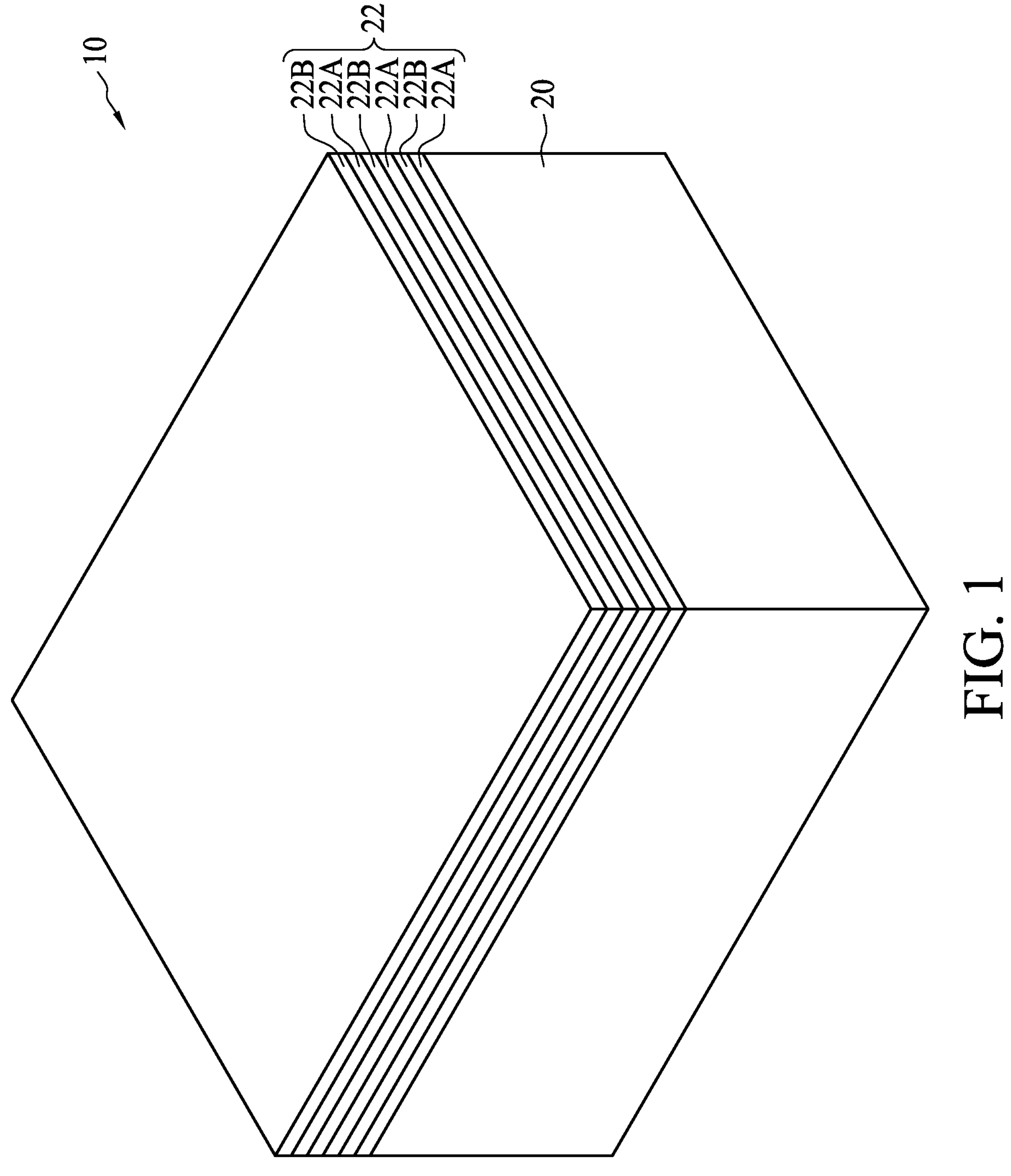
FIGS. 1-4, 5A, 5B, 6A, 6B, 7A, 7B, 8A, 8B, 9A, 9B, 10A, 10B, 10C, 11, 12A, 12B, 13A, 13B, 13C, 14, 15A, 15B, 16A, and 16B illustrate the views of intermediate stages in the formation of Gate-All-Around (GAA) transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate-All-Around (GAA) transistors, Cut-Metal-Gate (CMG) isolation regions, Continuous Polysilicon on Diffusion edge (CPODE) isolation regions, Continuous metal on Diffusion edge (CMODE) isolation regions, and the method of forming the same are provided. In accordance with some embodiments of the present disclosure, the CMG isolation regions are fully separate from, and are not in contact with, the CPODE isolation regions and CMODE isolation regions. This results in reduced damage without increasing parasitic capacitance.

In the illustrated embodiments, the formation of GAA Transistors is used as an example to explain the concept of the present disclosure. Other types of transistors such as Fin Field-Effect Transistors (FinFETs), planar transistors, or the like may also adopt the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 10C, 11, 12A, 12B, 13A, 13B, 13C, 14, 15A, 15B, 16A, and 16B illustrate the views of intermediate stages in the formation of GAA transistors in accordance with some embodiments of the present disclosure. The corresponding processes are also reflected schematically in the process flow shown in FIG. 22.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown as in FIG. 22. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the first layer 22A has thickness in the range between about 4 nm and 7 nm, while the second layer 22B has thickness in the range between about 8 nm and 12 nm, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there may be some pad oxide layer(s) and hard mask layer(s) (not shown) formed over multilayer stack 22. These layers are patterned, and are used for the subsequent patterning of multilayer stack 22.

Figure 2:
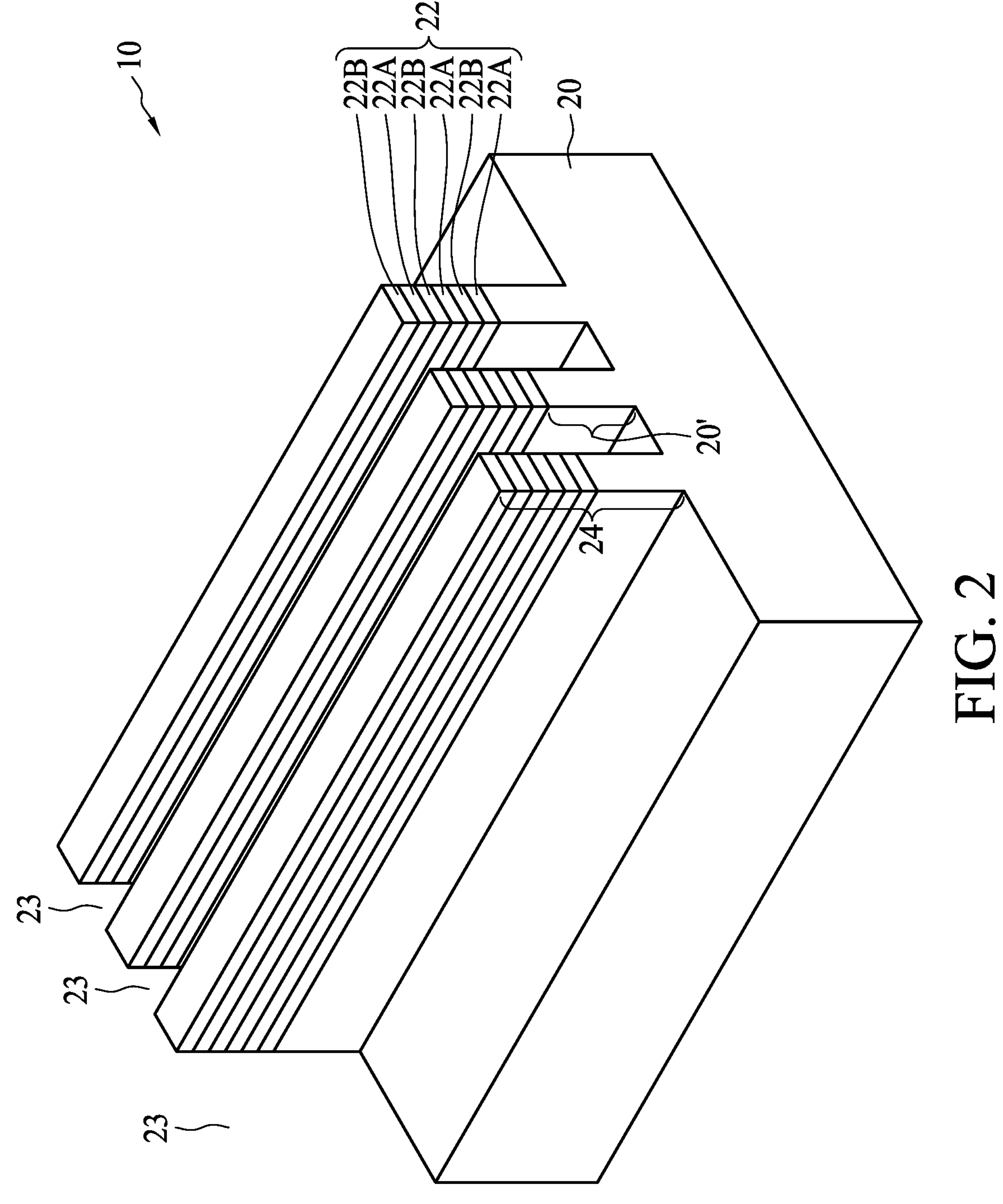

Referring to FIG. 2, multilayer stack 22 and a portion of the underlying substrate 20 are patterned in an etching process(es), so that trenches 23 are formed. The respective process is illustrated as process 204 in the process flow 200 shown as in FIG. 22. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' (alternatively referred to as semiconductor strips 20') hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
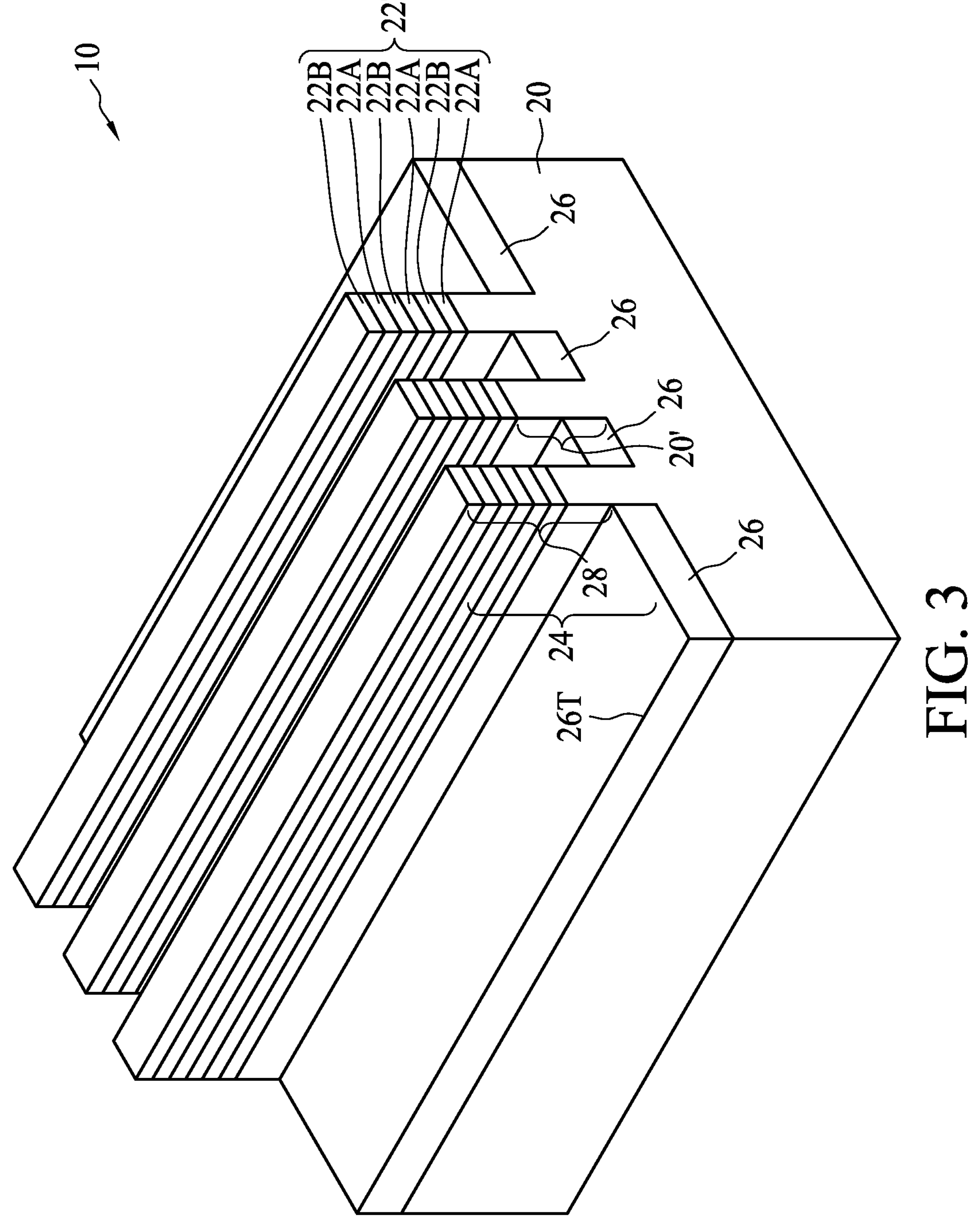

FIG. 3 illustrates the formation of isolation regions 26, which are also referred to as Shallow Trench Isolation (STI) regions throughout the description. The respective process is illustrated as process 206 in the process flow 200 shown as in FIG. 22. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
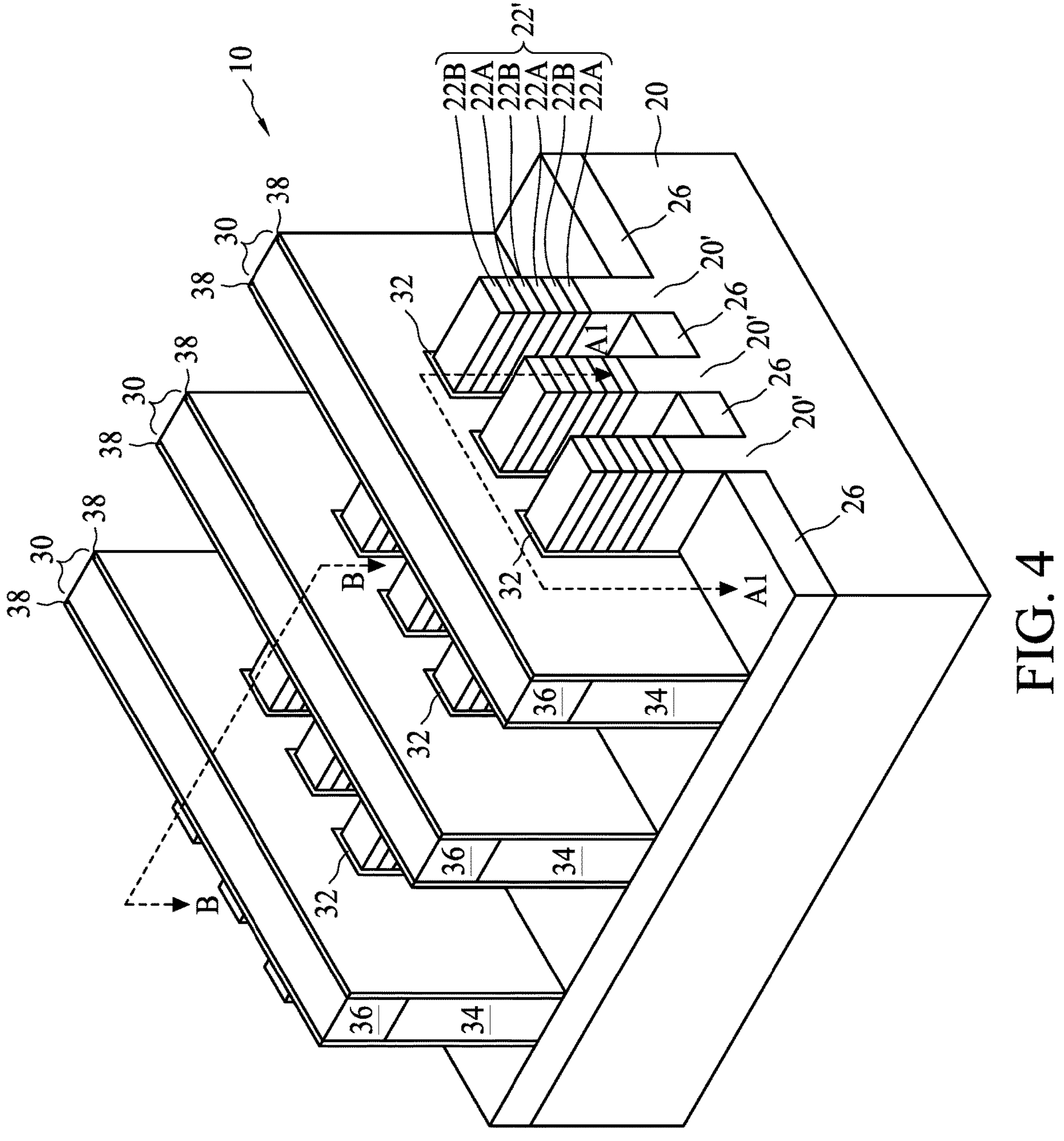

Referring to FIG. 4, dummy gate stacks 30 and gate spacers 38 are formed on the top surfaces and the sidewalls of (protruding) fins 28. The respective process is illustrated as process 208 in the process flow 200 shown as in FIG. 22. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used.

Each of dummy gate stacks 30 may also include one (or a plurality of) hard mask layer 36 (also referred to as a hard mask 36) over dummy gate electrode 34. Hard mask layers 36 (also referred to as hard masks 36) may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process (es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide (SiO), silicon carbide (SiC), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 19:
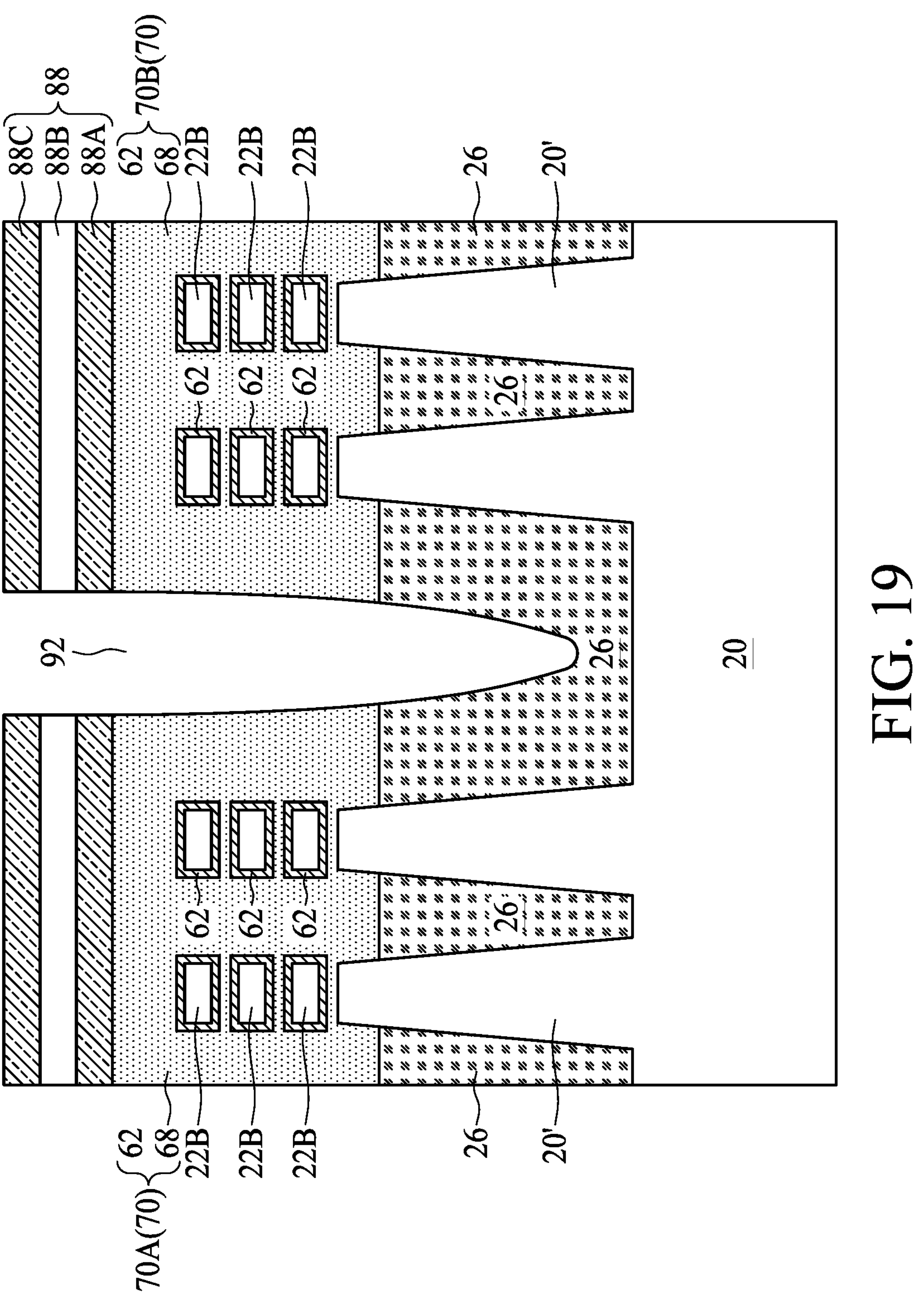
Figure 20:
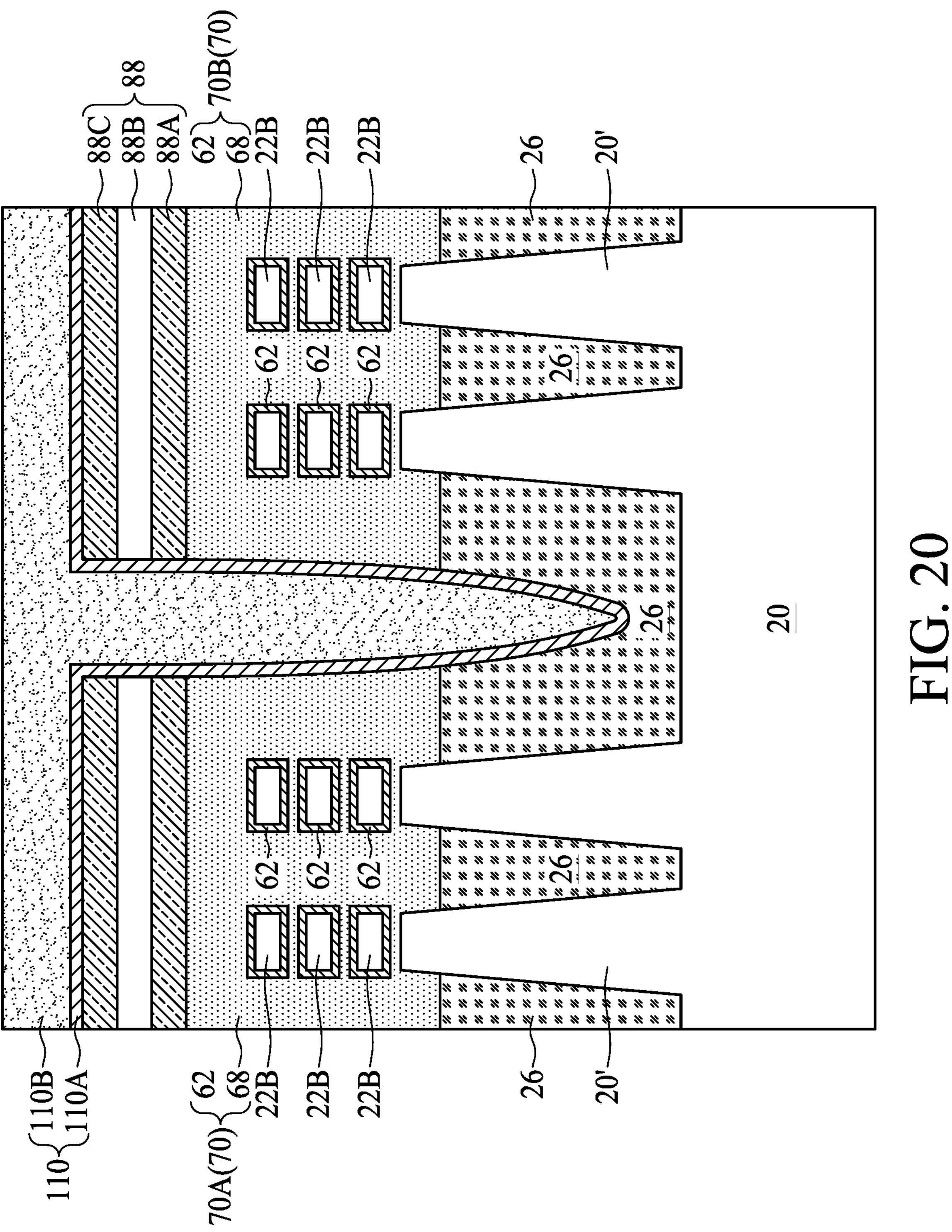
Figure 21:
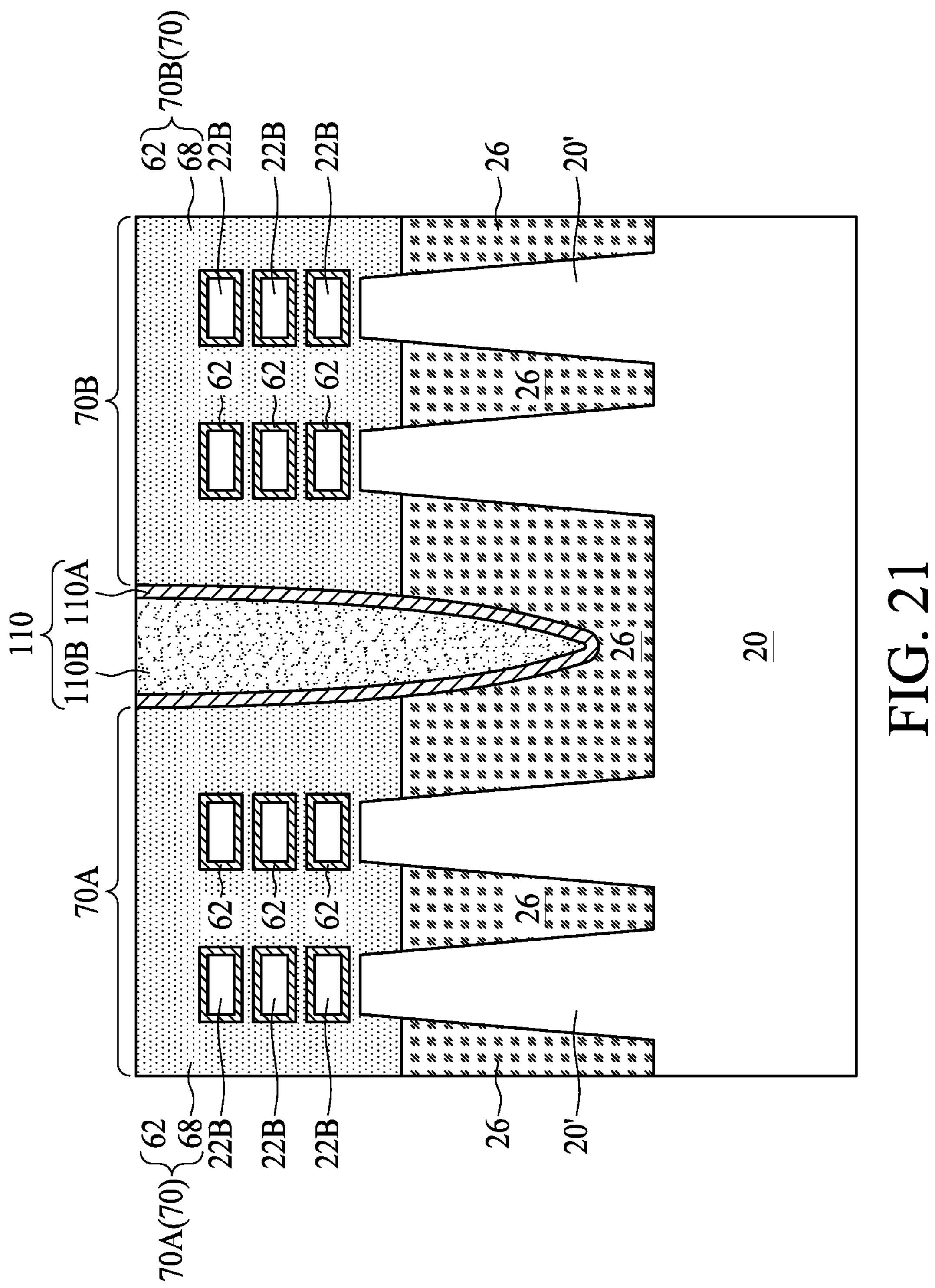

In accordance with alternative embodiments, one or more layers of gate spacers 38 may be formed using the processes as illustrated in FIG. 19, and the resulting layer of gate spacers 38 comprises the material as discussed referring to FIGS. 19 through 21. For example, gate spacers 38 may be formed of or include SiOCNH therein. The details of the formation processes are discussed in subsequent paragraphs.

Figures 5A, 5B:
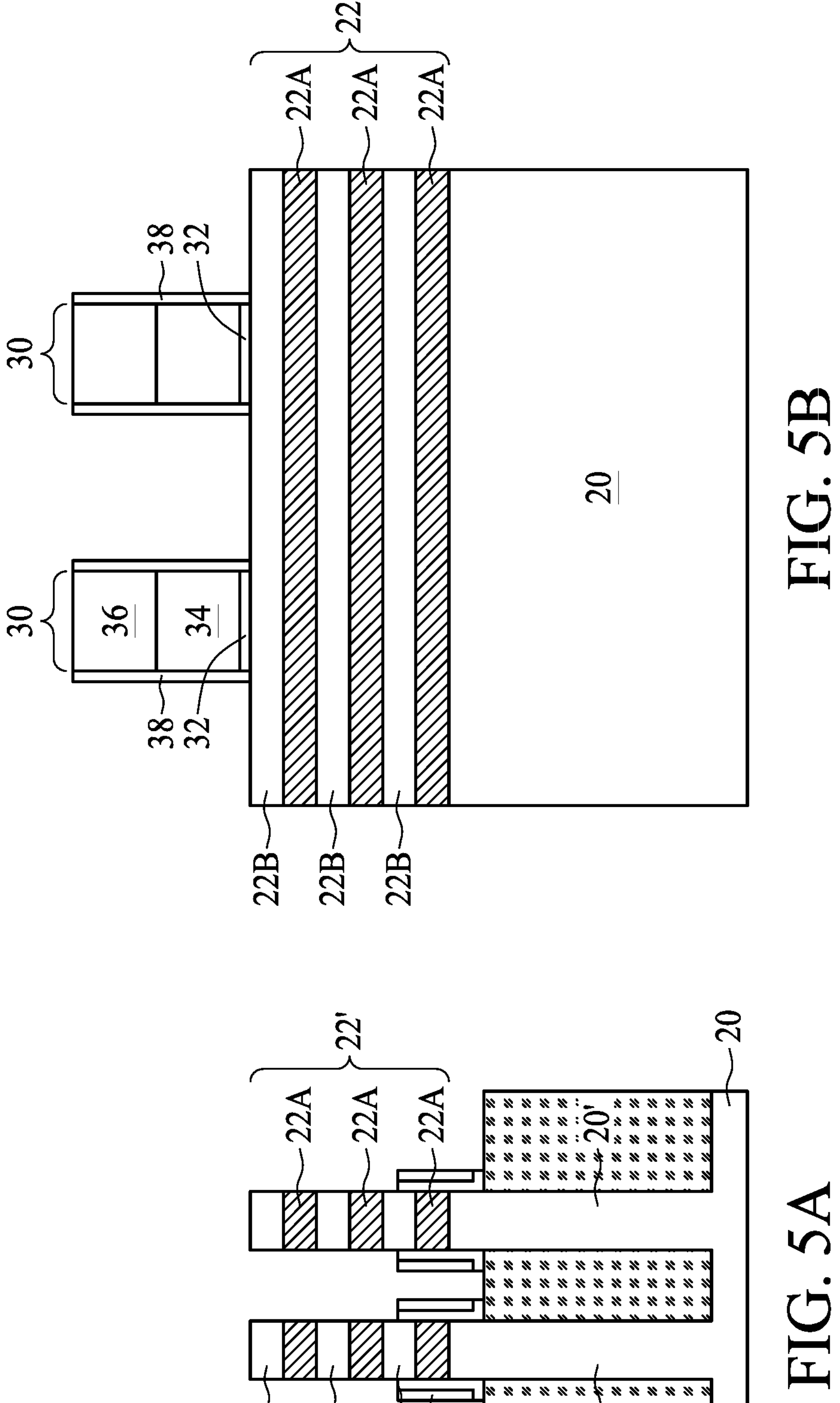

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
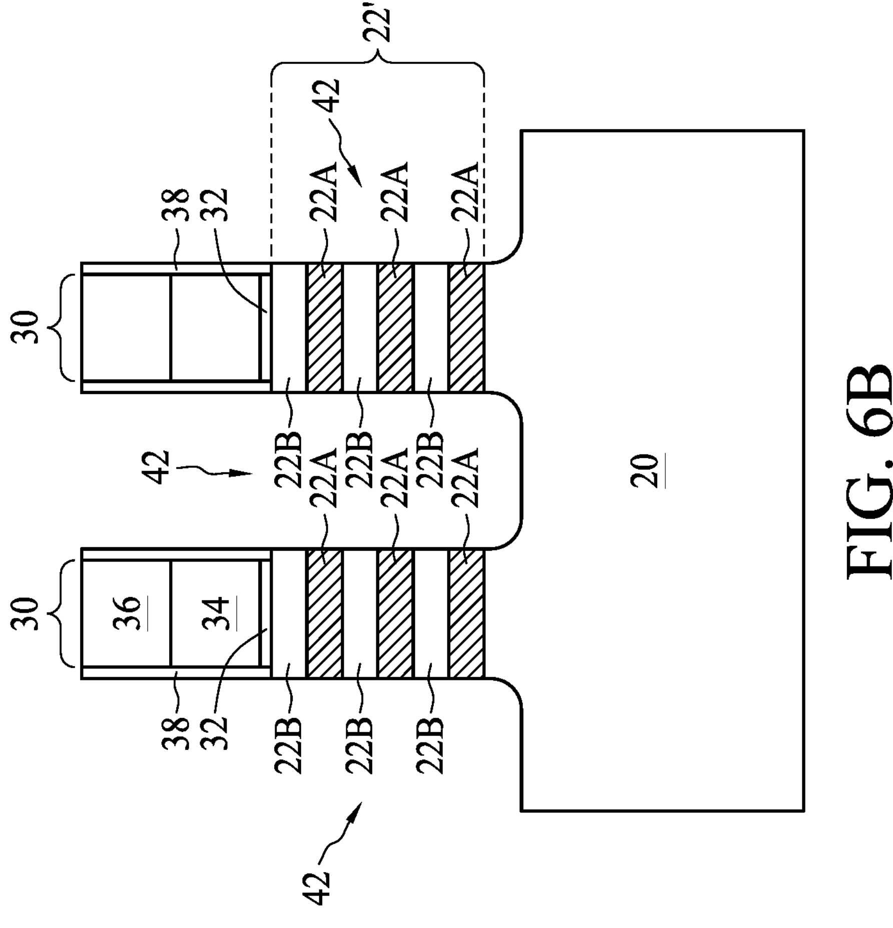
Figure 6A:
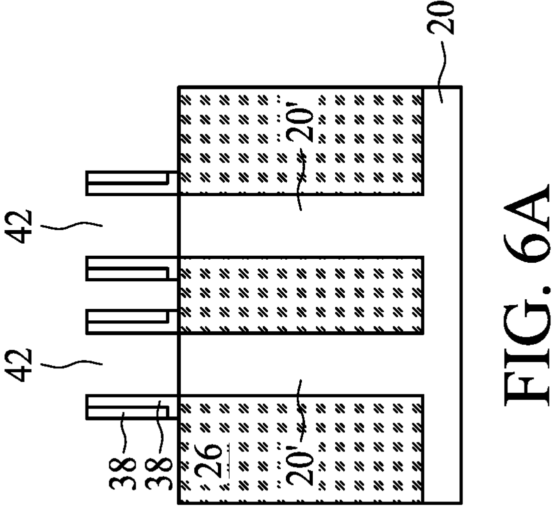

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown as in FIG. 22. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer stacks 22' and the underlying substrate strips 20'. The bottoms of recesses 42 are at least level with, or may be lower than (as shown in FIG. 6B), the bottoms of multilayer stacks 22'. The etching may be anisotropic, so that the sidewalls of multilayer stacks 22' facing recesses 42 are vertical and straight, as shown in FIG. 6B.

Figure 7B:
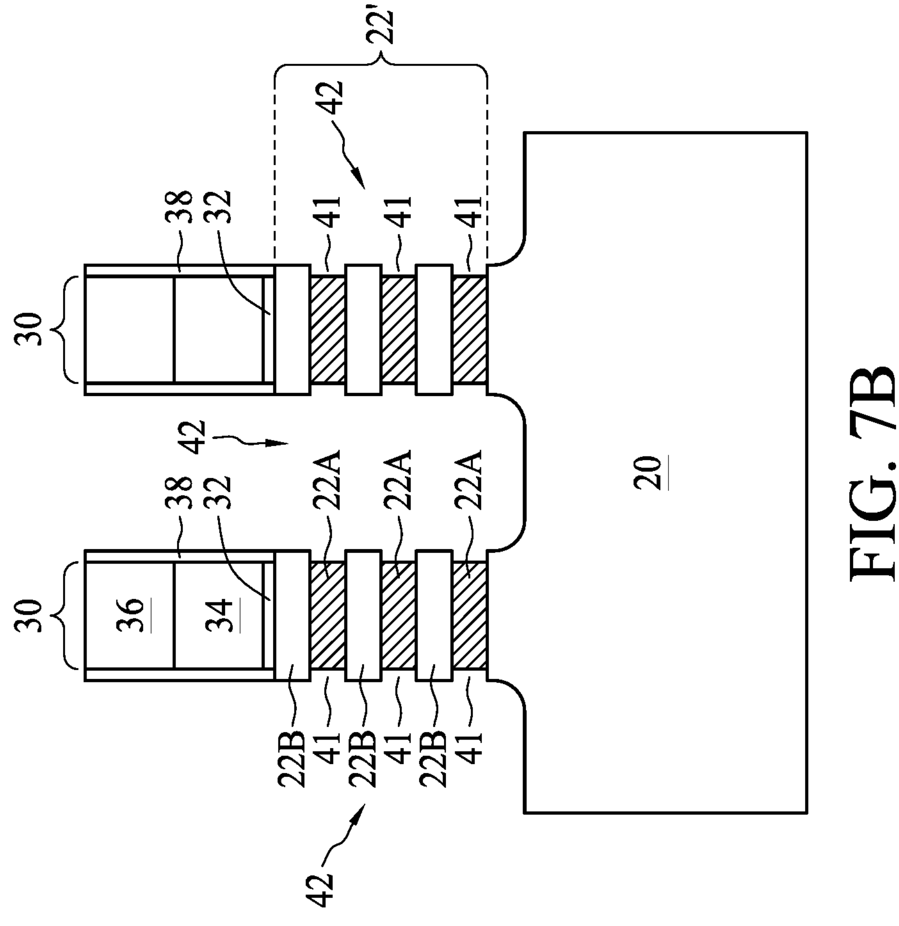
Figure 7A:
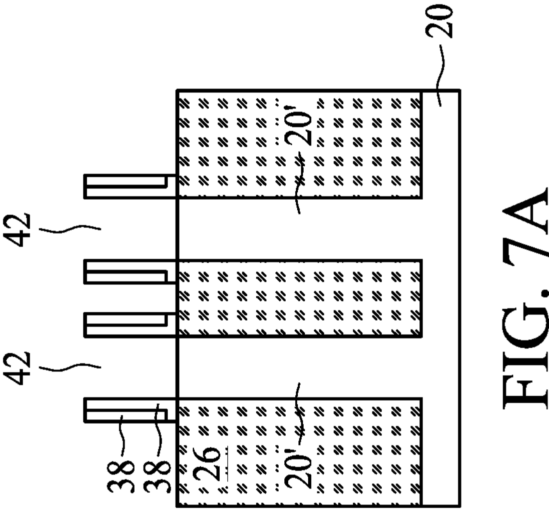

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown as in FIG. 22. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like.

In accordance with alternative embodiments, the lateral recessing of sacrificial semiconductor layers 22A is performed through an isotropic dry etching process or a combination of a dry etching process and a wet etching process.

Figure 8B:
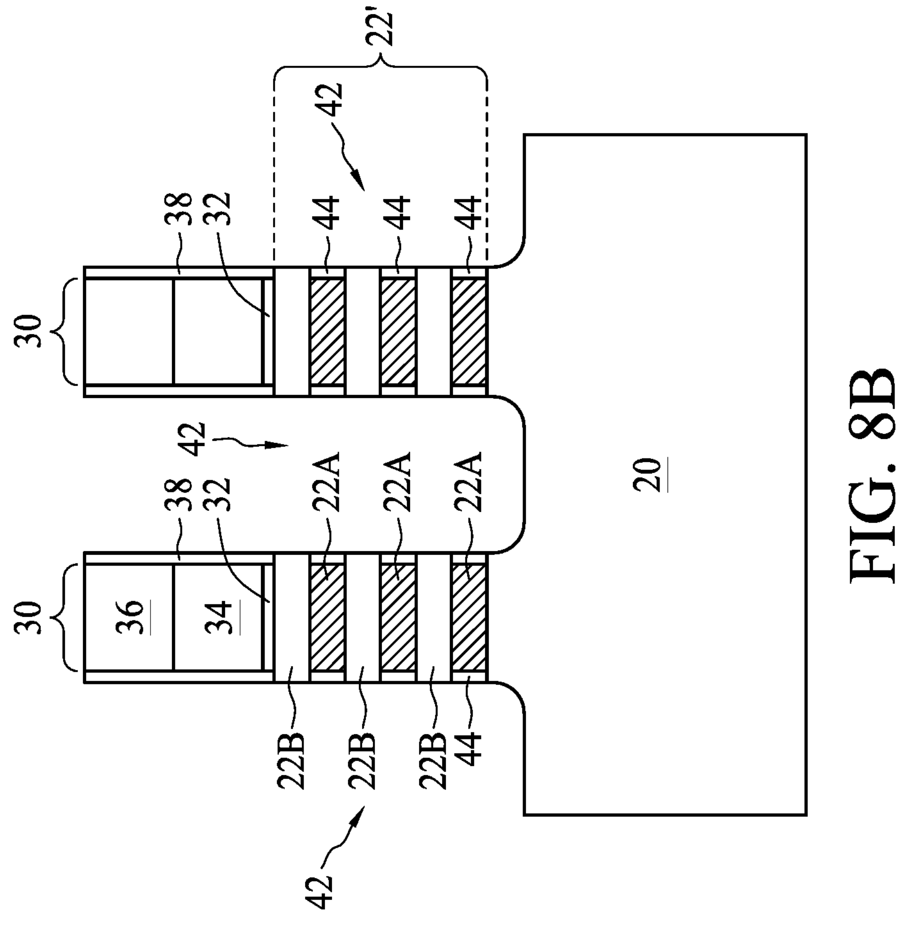
Figure 8A:
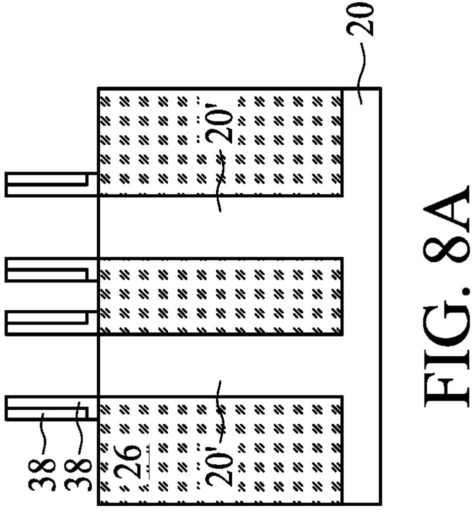

Referring to FIGS. 8A and 8B, inner spacers 44 are formed. The respective process is illustrated as process 214 in the process flow 200 shown as in FIG. 22. In accordance with some embodiments, the formation of inner spacers 44 includes depositing a conformal dielectric layer, which extends into the lateral recesses 41 (FIG. 7B). Next, an etching process (also referred to as a spacer trimming process) is performed to trim the portions of the spacer layer outside of the lateral recesses 41, leaving the portions of the spacer layer in the lateral recesses 41. The remaining portions of the spacer layer are referred to as inner spacers 44.

Figure 9B:
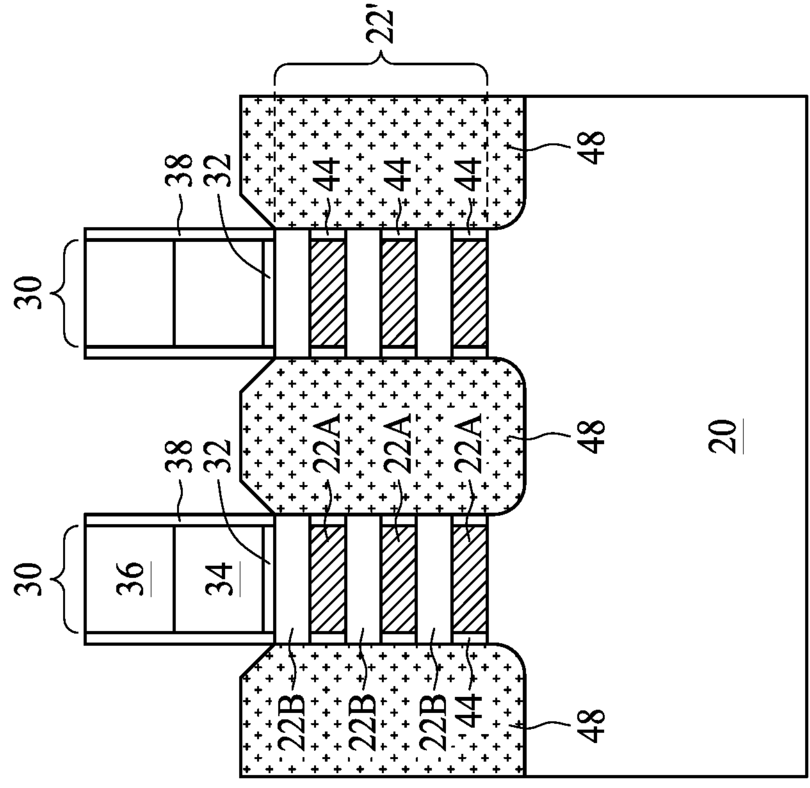
Figure 9A:
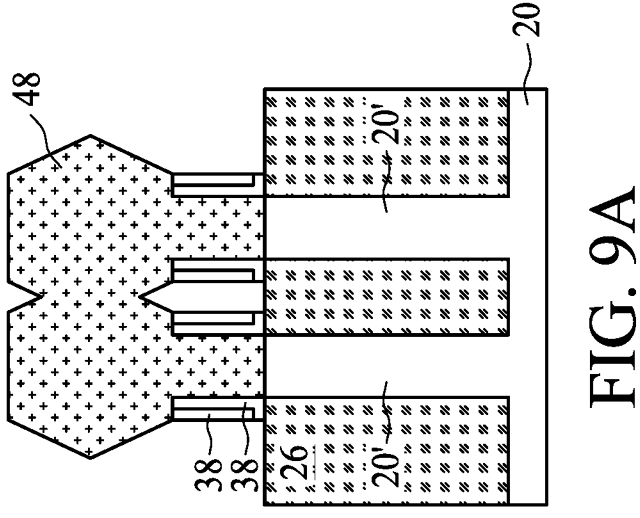

FIGS. 9A and 9B illustrate the cross-sectional views and a perspective view in the formation (epitaxy) source/drain regions 48 (also referred to as epitaxy regions 48) in recesses 42 through epitaxy. The respective process is illustrated as process 216 in the process flow 200 shown as in FIG. 22. Source/drain region(s) may refer to a source or a drain, individually or collectively dependent upon the context. In accordance with some embodiments, the source/drain regions 48 may exert stress on the nanostructures 22B, which are used as the channels of the corresponding GAA transistors, thereby improving performance.

In accordance with some embodiments, the corresponding transistor is n-type, and epitaxial source/drain regions 48 are accordingly formed as n-type by doping an n-type dopant. For example, silicon phosphorous (SiP), silicon carbon phosphorous (SiCP), or the like may be grown to form epitaxial source/drain regions 48. In accordance with alternative embodiments, the corresponding transistor is p-type, and epitaxial source/drain regions 48 are accordingly formed as p-type by doping a p-type dopant. For example, silicon boron (SiB), silicon germanium boron (SiGeB), or the like may be grown to form epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other, with voids 49 (FIG. 10C) being formed.

After the epitaxy process, epitaxy regions 48 may be further implanted with an n-type impurity or a p-type impurity to form source and drain regions, which are also denoted using reference numeral 48. In accordance with alternative embodiments of the present disclosure, the implantation process is skipped when epitaxy regions 48 are in-situ doped with the n-type impurity or p-type impurity during the epitaxy, and the epitaxy regions 48 are also source/drain regions.

Figure 10B:
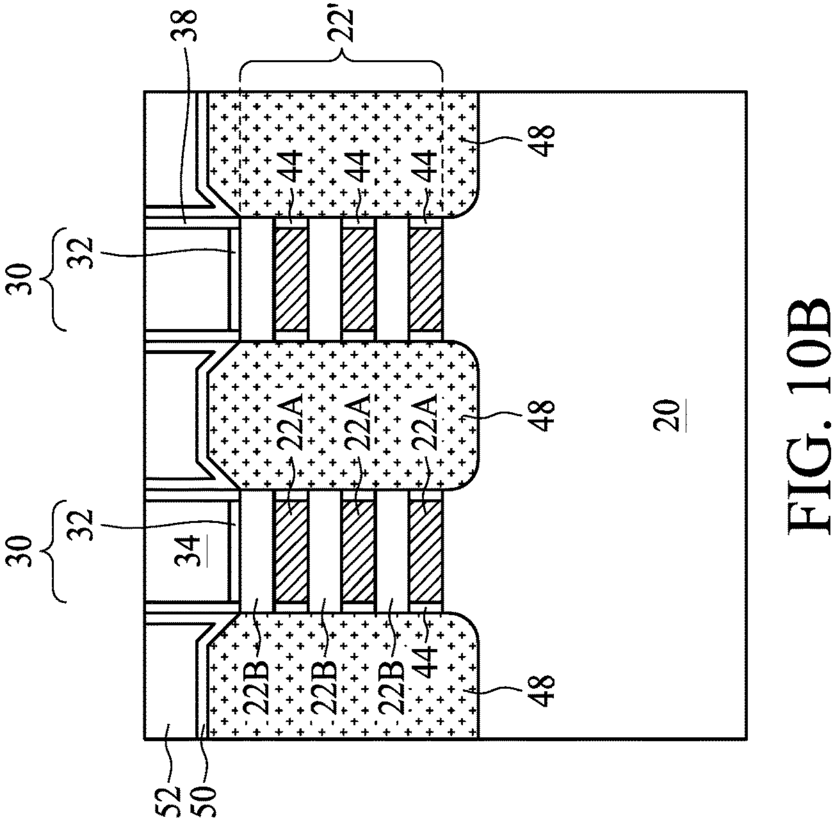
Figure 10A:
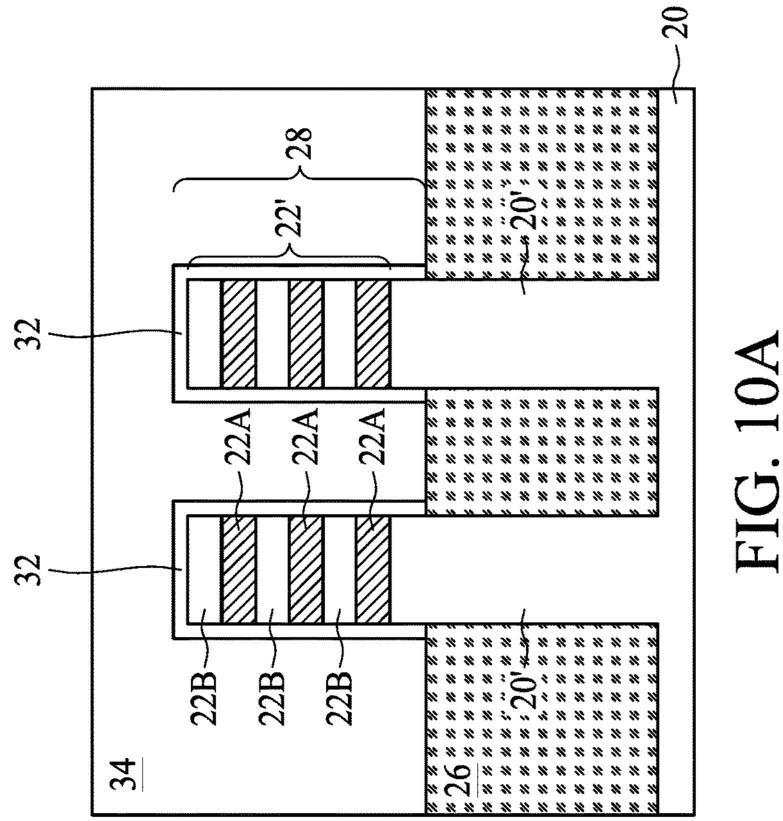

FIGS. 10A and 10B illustrate the cross-sectional views of the structure after the formation of Contact Etch Stop Layer (CESL) 50 and Inter-Layer Dielectric (ILD) 52. The respective process is illustrated as process 218 in the process flow 200 shown as in FIG. 22. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

CESL 50 and ILD 52 are planarized through a planarization process such as a CMP process or a mechanical grinding process. In accordance with some embodiments, the planarization process may remove hard masks 36 to reveal dummy gate electrodes 34, as shown in FIG. 10A. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 10C:
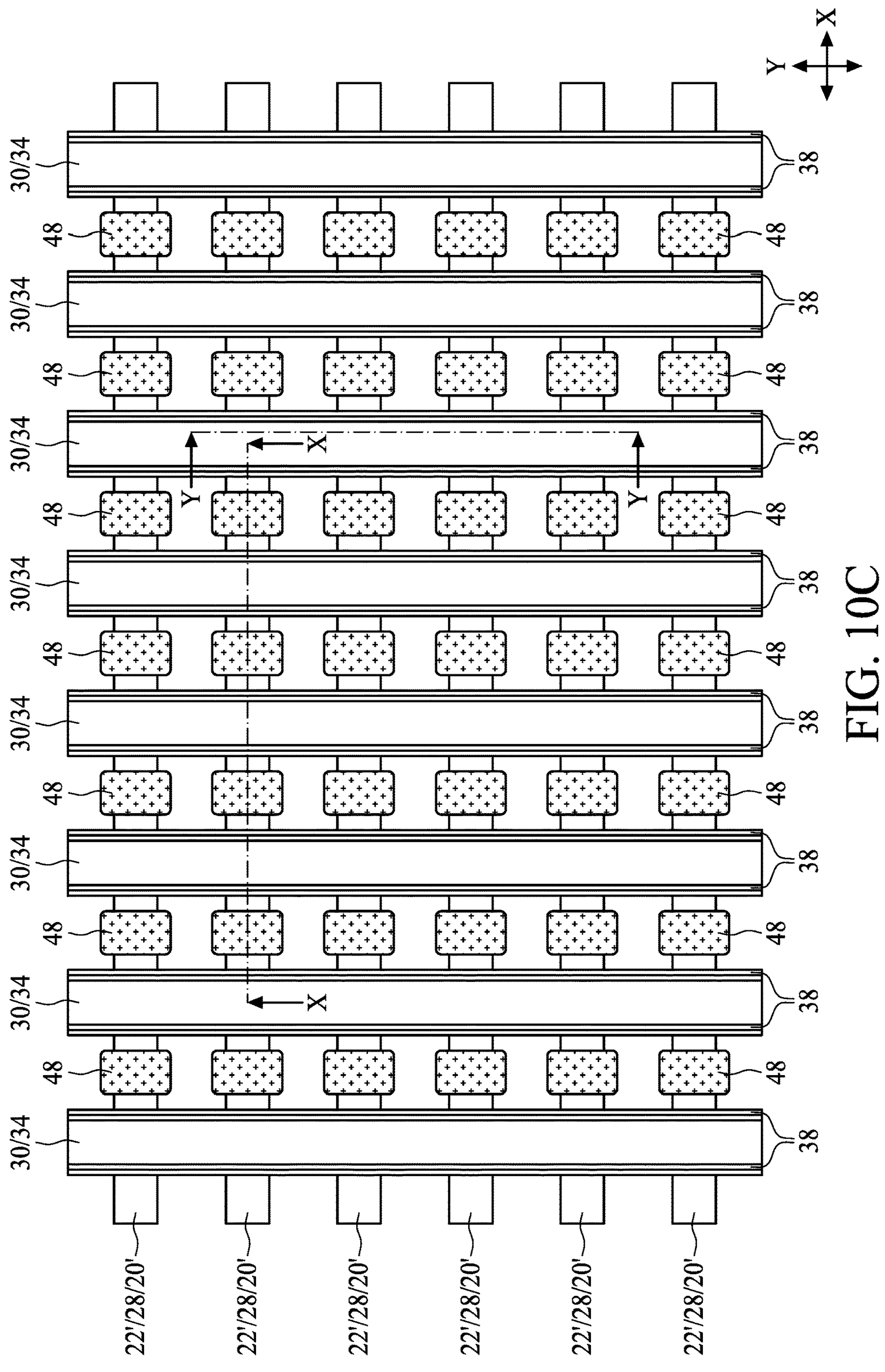

FIG. 10C illustrates a top view of the structure shown in FIGS. 10A and 10B in accordance with some embodiments. Multilayer stacks 22', substrate strips 20', and protruding fins 28 (refer to FIG. 10A) have lengthwise directions in the X-direction, and the corresponding cross-sectional view is referred to as the X-cut view. Gate stacks 30, which includes dummy gate electrodes 34 (such as polysilicon strips) have lengthwise directions in the Y-direction, and the corresponding cross-sectional view is referred to as the Y-cut view. Source/drain regions 48 are formed based on some portions of the multilayer stacks 22' (as viewed in FIGS. 5B and 10B). The edges of source/drain regions may be in contact with, or may be spaced apart from, gate spacers 38.

Figure 11:
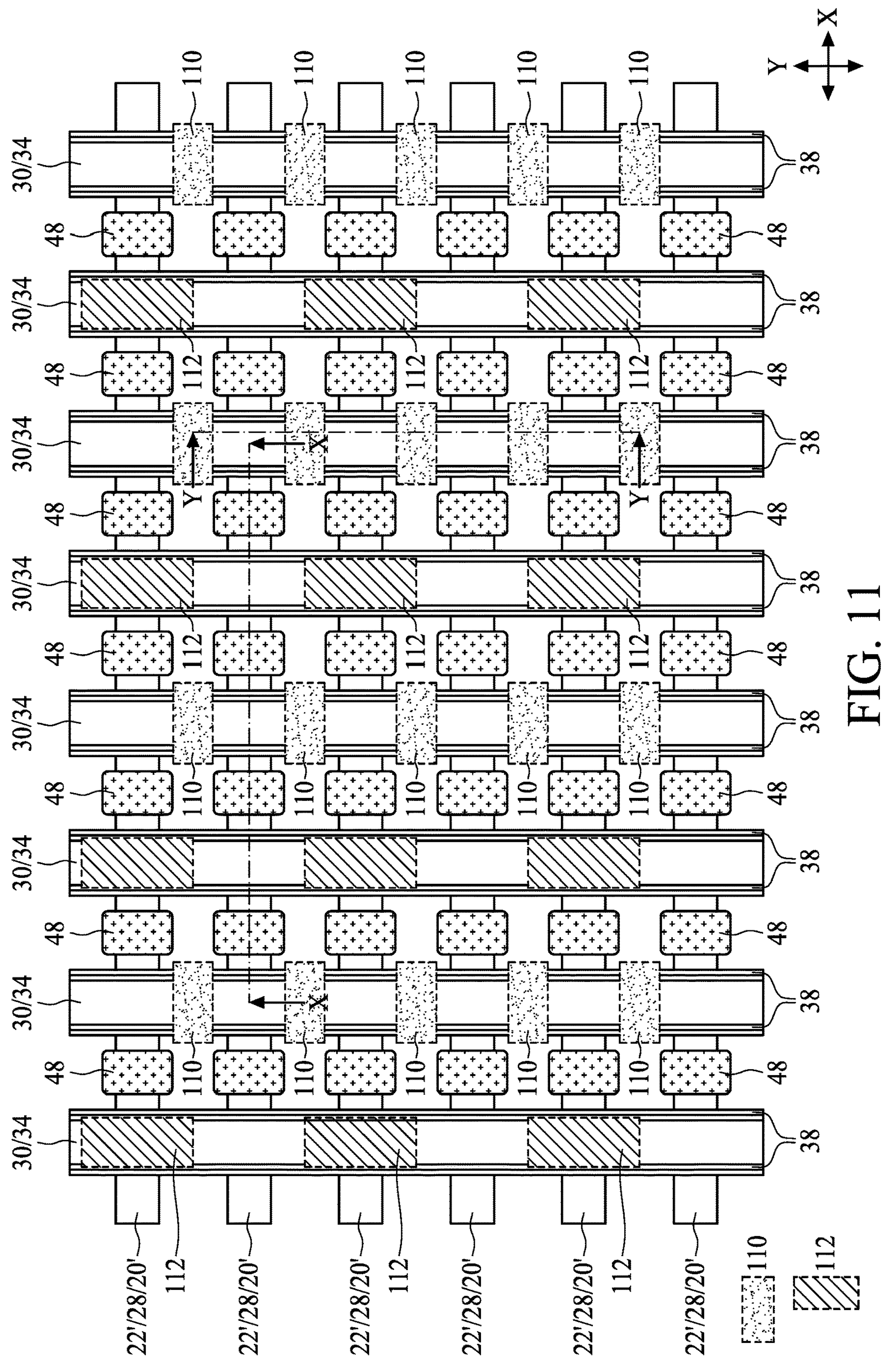
Figure 14:
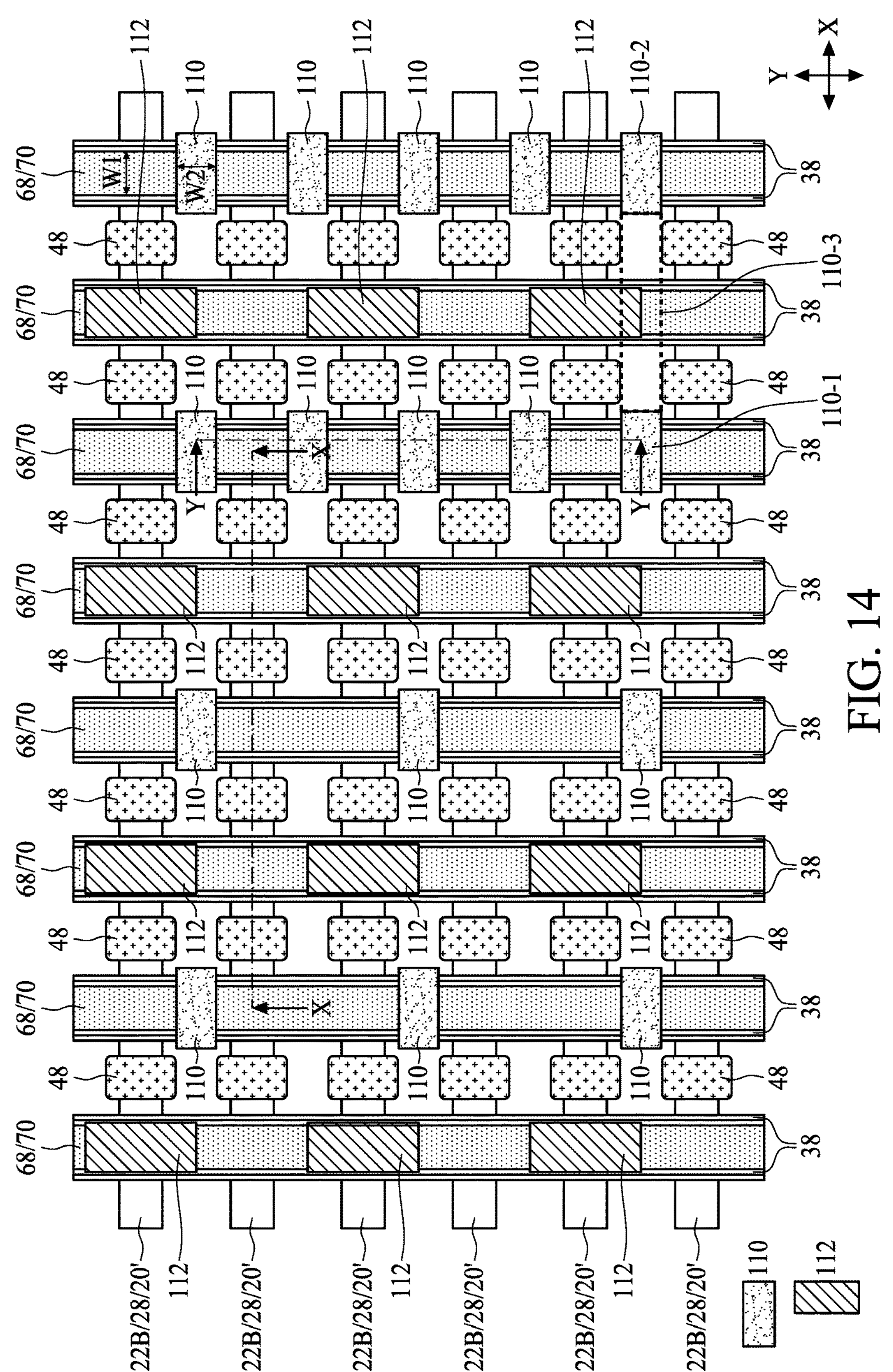

FIG. 11 illustrates the top view of the formation of Cut-Metal Gate (CMG) isolation regions 110, whose formation separates/divides the dummy gate stacks 30 and hence resulting in the dividing of the subsequently formed replacement (metal) gate stacks 70 into shorter portions. The respective process is illustrated as process 220 in the process flow 200 shown as in FIG. 22. CMG isolation regions 110 are also referred to as gate isolation regions 110. In accordance with some embodiments, the CMG isolation regions 110 are formed by cutting dummy gate stacks 30, as shown in FIG. 11. In accordance with alternative embodiments, the CMG isolation regions 110 are formed by cutting replacement gate stack 70, as shown in FIG. 14. Accordingly, the CMG isolation regions 110 are shown as being dashed in FIG. 11 to indicate that the CMG isolation regions 110 may have, or may have not, been formed in the structure shown in FIG. 11.

The detailed process for forming CMG isolation regions 110 may be realized from the processes shown in FIGS. 17-21. Although FIGS. 17-21 illustrate the processes for cutting replacement gate stacks 70 to form CMG isolation regions 110, the same processes may be used for cutting dummy gate stacks 30.

FIG. 11 further illustrates the top view of the formation of fin isolation regions 112. In accordance with some embodiments, as shown in FIG. 11, fin isolation regions 112 are Continuous Polysilicon on Diffusion edge (CPODE) regions, whose formation involves etching dummy gate stacks 30, multilayer stacks 22', and substrate strips 20'. The respective process is also illustrated as process 220 in the process flow 200 shown as in FIG. 22. In accordance with alternative embodiments, fin isolation regions 112 are formed by cutting replacement gate stacks 70 and the underlying semiconductor regions, as shown in FIG. 14. Accordingly, fin isolation regions 112 are also shown as being dashed in FIG. 11 to indicate that fin isolation regions 112 may have, or may have not, been formed in the structure shown FIG. 11.

The detailed process for forming fin isolation regions 112 by cutting dummy gate stacks 30 are shown in FIGS. 22A and 22B through 28A and 28B. The detailed process for forming fin isolation regions 112 by cutting replacement gate stacks 70 are shown in FIGS. 29A and 29B through 33A and 33B, as will be discussed subsequently.

Figure 12B:
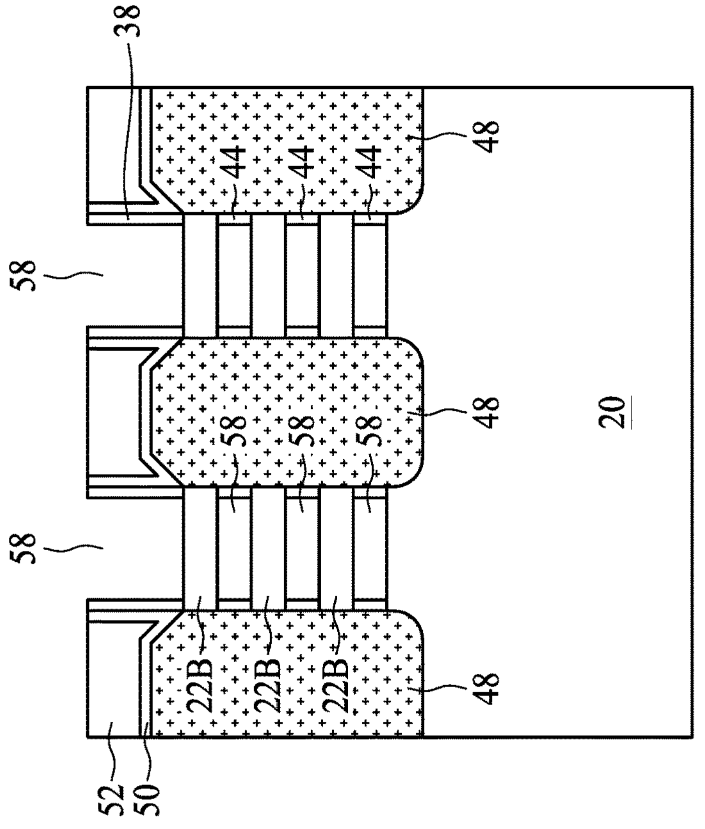
Figure 12A:
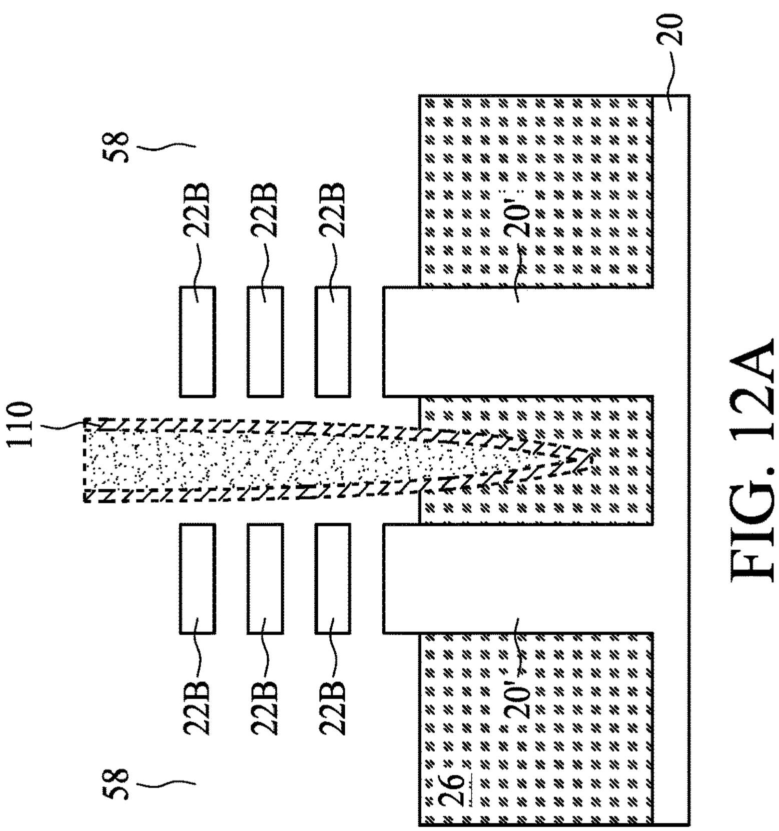

Next, dummy gate electrodes 34 and dummy gate dielectrics 32 (and hard masks 36, if remaining) are removed in one or more etching processes, so that recesses 58 are formed, as shown in FIGS. 12A and 12B. The respective process is illustrated as process 222 in the process flow 200 shown as in FIG. 22. In accordance with some embodiments, dummy gate electrodes 34 and dummy gate dielectrics 32 are removed through an anisotropic dry etch process(es). For example, the etching process may be performed using reaction gas(es) that selectively etch dummy gate electrodes 34 and dummy gate dielectrics 32 at faster rates than ILD 52. Each recess 58 exposes and/or overlies portions of multilayer stacks 22', which include the future channel regions in subsequently completed transistors. If the CMG isolation regions 110 have already been formed, the CMG isolation regions 110 (which is shown as being dashed in FIG. 12) will separate long recesses 58 into shorter portions.

Sacrificial layers 22A are then removed to extend recesses 58 between nanostructures 22B. The respective process is illustrated as process 224 in the process flow 200 shown as in FIG. 22. Sacrificial layers 22A may be removed by performing an isotropic etching process such as a wet etching process using etchants which are selective to the materials of sacrificial layers 22A, while nanostructures 22B, substrate 20, and STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A.

Figures 13A, 13B:
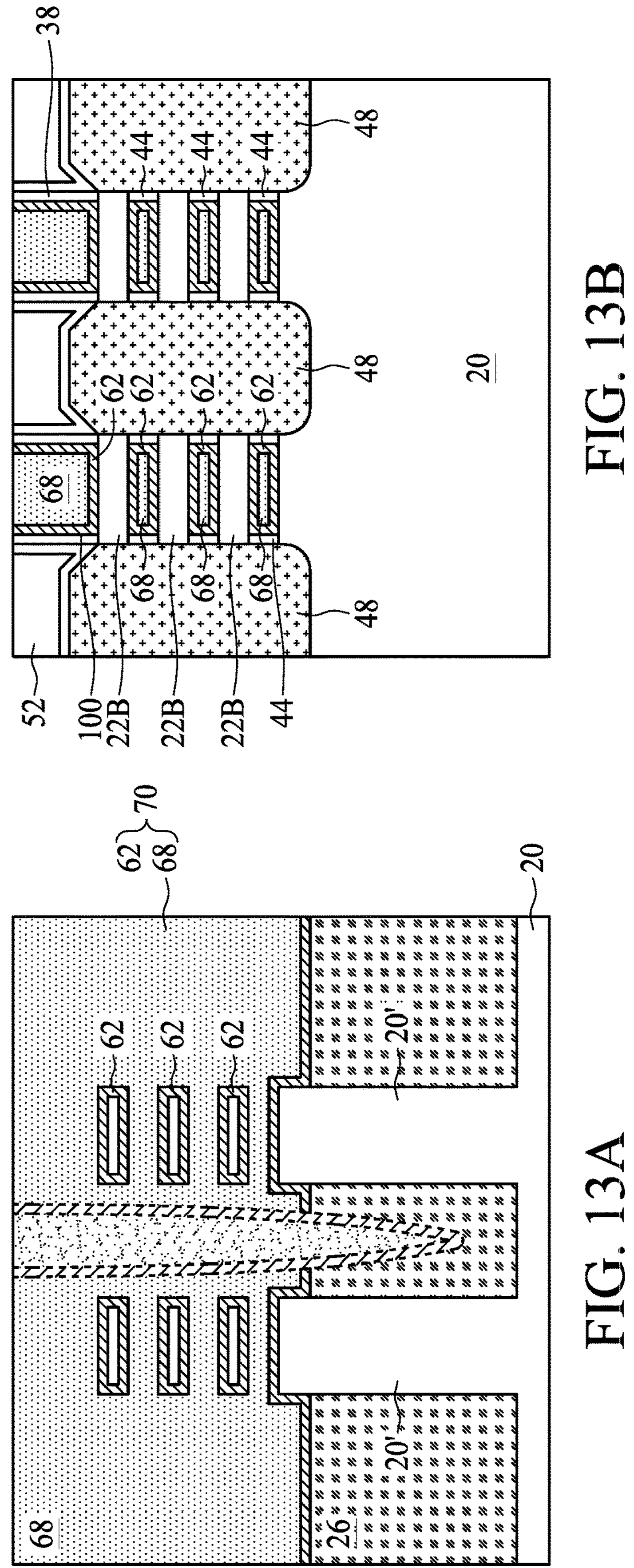

Referring to FIGS. 13A and 13B, gate dielectrics 62 and gate electrodes 68 are formed, hence forming replacement gate stacks 70. The respective process is illustrated as process 226 in the process flow 200 shown as in FIG. 22. In accordance with some embodiments, each of gate dielectric 62 includes an interfacial layer and a high-k dielectric layer on the interfacial layer. The interfacial layer may be formed of or comprises silicon oxide, which may be deposited through a conformal deposition process such as ALD or CVD, or through an oxidation process. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Gate electrodes 68 are also formed. In the formation, conductive layers are first formed on the high-k dielectric layer, and the remaining portions of recesses 58 are filled. Gate electrodes 68 may include a metal-containing material such as TiN, TaN, TiAl, TiAlC, cobalt, ruthenium, aluminum, tungsten, combinations thereof, and/or multilayers thereof. For example, gate electrodes 68 may comprise any number of layers, any number of work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting transistors.

Figure 13C:
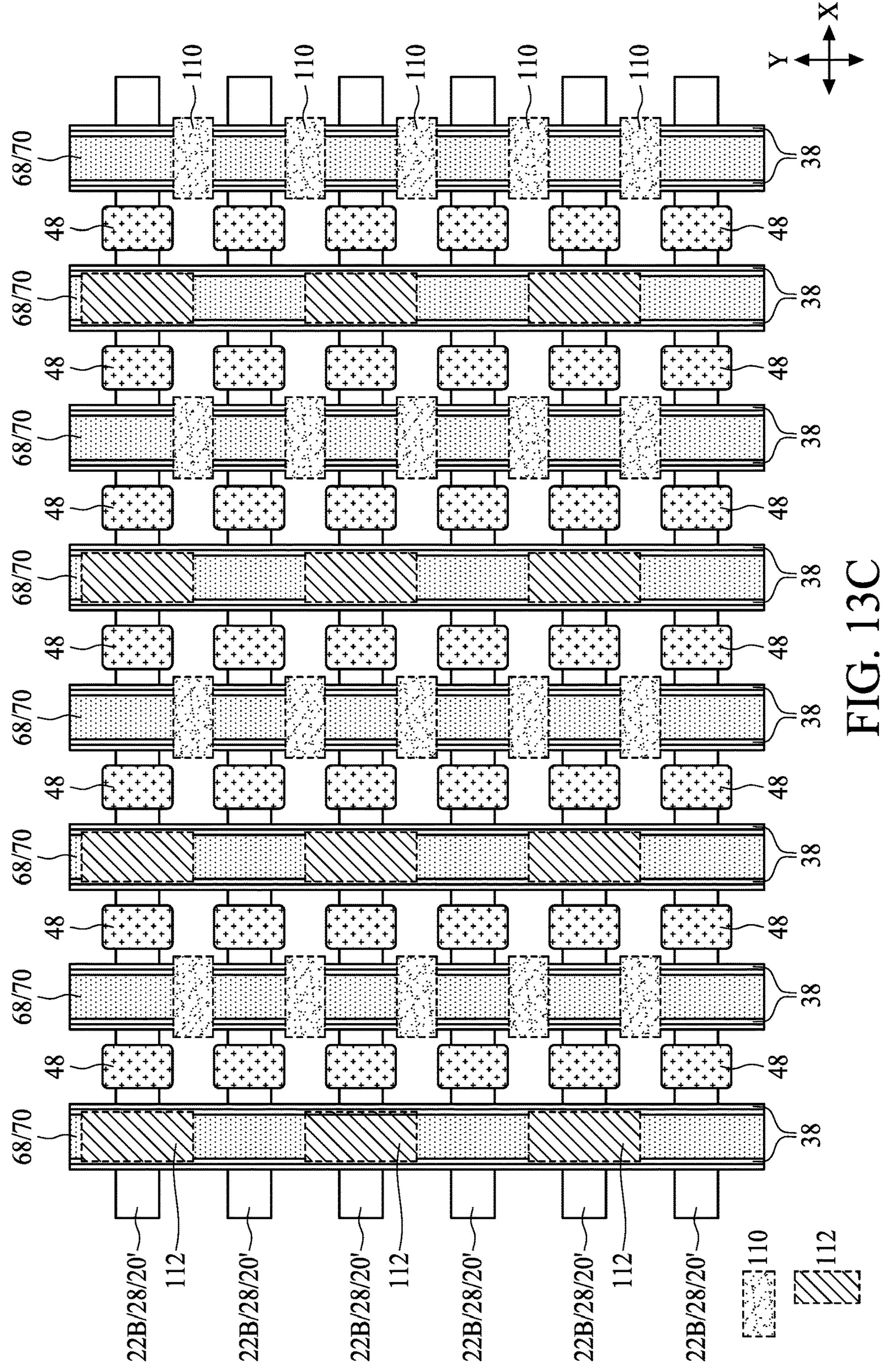

FIG. 13C illustrates a top view of the structure shown in FIGS. 13A and 13B in accordance with some embodiments. The structure shown in FIG. 13C is similar to the structure shown in FIG. 11, except that the dummy gate stacks 30 in FIG. 10C has been replaced with the replacement gate stacks 70 in FIG. 13C. Nanostructures 22B and the underlying semiconductor strips 20' have lengthwise direction in the X-direction.

As aforementioned, CMG isolation regions 110 may have already been formed in the process shown in FIG. 11. Alternatively, CMG isolation regions 110 may have not been formed yet. Similarly, fin isolation regions 112 may have already been formed in the process shown in FIG. 11. Alternatively, fin isolation regions 112 may have not been formed yet. Accordingly, CMG isolation regions 110 and fin isolation regions 112, if not formed yet, will be formed in the process shown in FIG. 14. The respective process is illustrated as process 228 in the process flow 200 shown as in FIG. 22.

The detailed processes for forming CMG isolation regions 110 are shown in FIGS. 17-21. The detailed processes for forming fin isolation regions 112 by cutting replacement gate stacks 70 are shown in FIGS. 29A and 29B through 33A and 33B, as will be discussed subsequently.

In accordance with some embodiments, as shown in both of FIGS. 11 and 14, CMG isolation regions 110 are physically separated from, and do not touch, fin isolation regions 112. Accordingly, the formation of CMG isolation regions 110 and the formation of fin isolation regions 112 do not affect each other. CMG isolation regions 110 thus may be formed before or after the formation of fin isolation regions 112, regardless of whether fin isolation regions 112 are formed by cutting the dummy gate stacks or the replacement gate stacks.

Figures 15A, 15B:
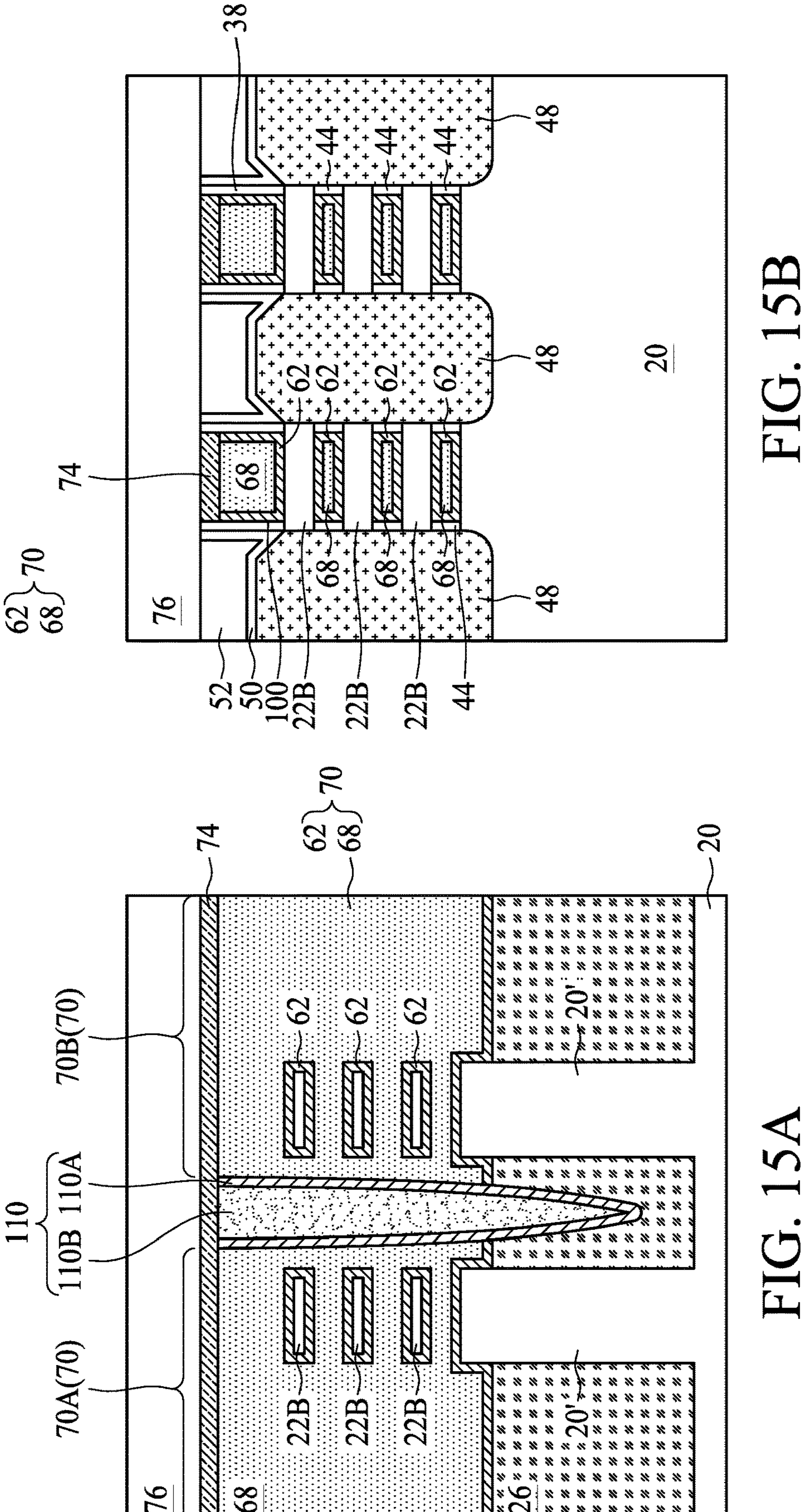

FIG. 15A illustrates a cross-sectional view of the structure shown in FIG. 14, in which CMG isolation region 110 has been formed to cut long metal gate stacks 70 into metal gate stacks (portions) 70A and 70B. Next, as also shown in FIGS. 15A and 15B, gate stacks 70 are recessed, so that recesses (occupied by CMG isolation region 110) are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52.

As further illustrated by FIGS. 15A and 15B, ILD 76 is deposited over ILD 52 and over gate masks 74. The respective process is illustrated as process 230 in the process flow 200 shown as in FIG. 22. An etch stop layer (not shown), may be, or may not be, deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figures 16A, 16B:
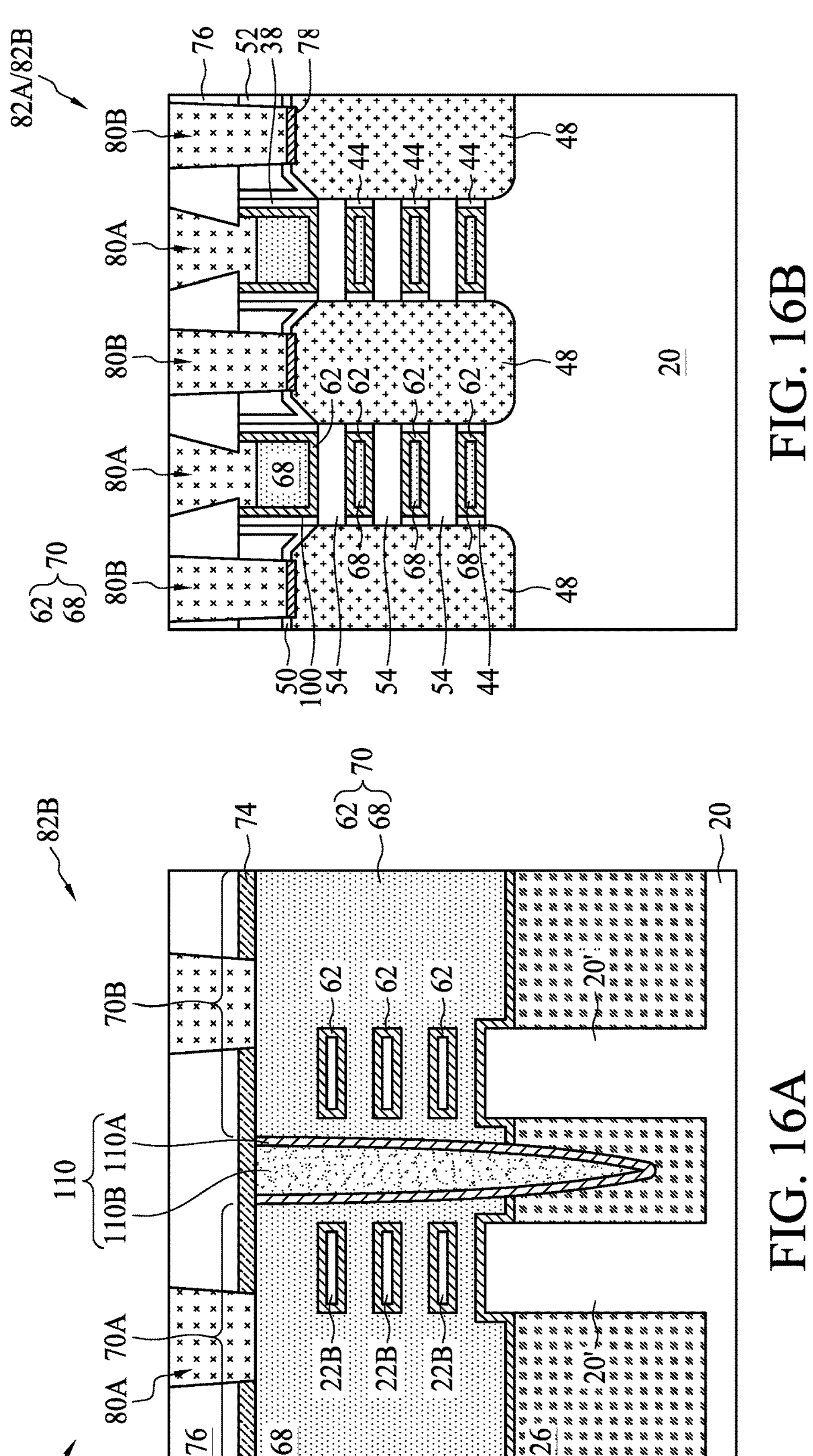

In FIGS. 16A and 16B, ILD 76, ILD 52, CESL 50, and gate masks 74 are etched to form recesses (occupied by contact plugs 80A and 80B) exposing surfaces of source/drain regions 48 and/or gate stacks 70. The recesses may be formed through etching using an anisotropic etching process(es), such as RIE, NBE, or the like.

After the recesses are formed, silicide regions 78 are formed over source/drain regions 48. The respective process is illustrated as process 232 in the process flow 200 shown as in FIG. 22. Contact plugs 80B are then formed over silicide regions 78. Also, contact plugs 80A (may also be referred to as gate contact plugs) are formed in the recesses, and are over and contacting gate electrodes 68. The respective process is illustrated as process 234 in the process flow 200 shown as in FIG. 22. Transistors 82A and 82B are thus formed. Although FIG. 16B illustrates that contact plugs 80A and 80B are in a same cross-section, in various embodiments, contact plugs 80A and 80B may be formed in different cross-sections, thereby reducing the risk of shorting with each other.

Figure 17:
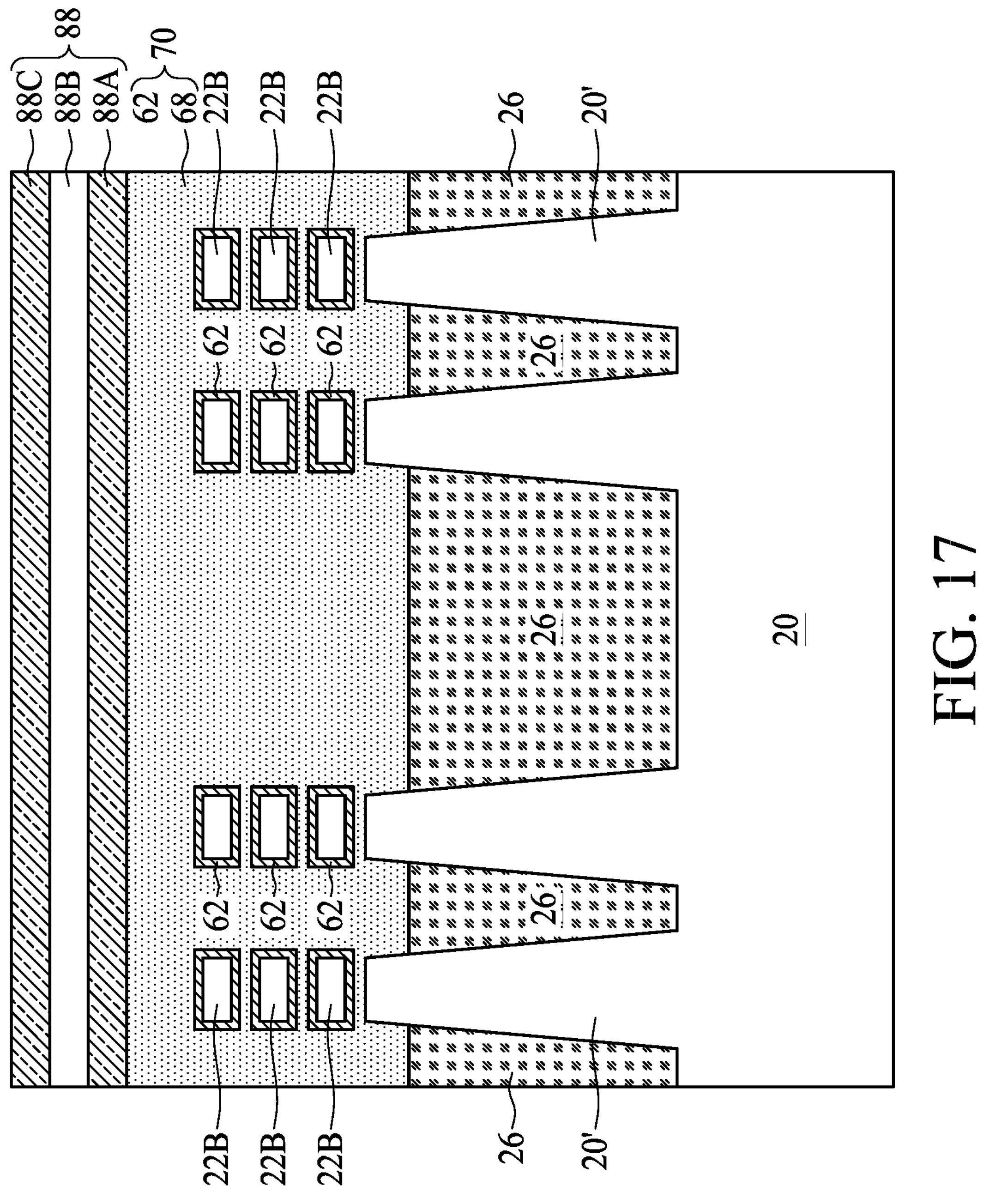
FIGS. 17-21 illustrate the formation of cut-metal-gate regions in accordance with some embodiments.

FIGS. 17 through 21 illustrate the formation of CMG isolation region 110 in accordance with some embodiments. FIG. 17 illustrates a cross-sectional view of an intermediate structure, which is also shown in FIG. 13A, in which gate stack 70 has been formed, and includes gate dielectrics 62 and gate electrode 68, while CMG isolation region 110 has not been formed yet.

In accordance with some embodiments, hard mask layer 88 (also referred to as hard mask 88) is deposited, and may include a multi-layer structure including a plurality of layers. In accordance with some embodiments, hard mask layers 88 include silicon nitride layer 88A, silicon layer 88B, and silicon nitride layer 88C. In accordance with alternative embodiments, a single-layer hard mask 88 is used, which may be formed of or comprise silicon nitride.

Figure 18:
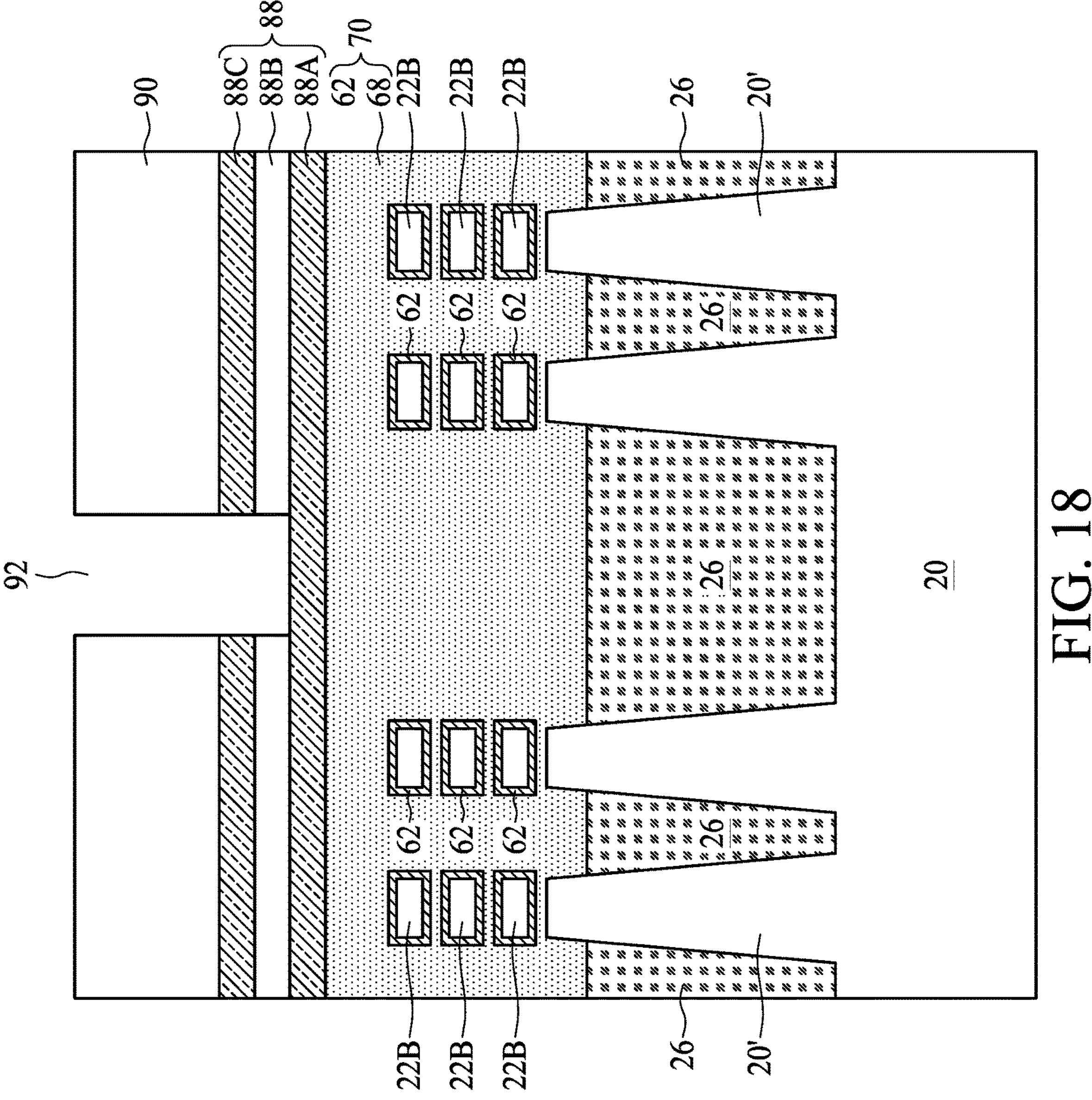

Etching mask 90 is then formed, as shown in FIG. 18. Etching mask 90 may also have a single-layer structure (which may include a photoresist) or a dual-layer structure including a Bottom Anti-reflective Coating (BARC) and a photoresist. Alternatively, etching mask 90 may have a tri-layer, which may include a bottom layer, a middle layer over the bottom layer, and a top layer, which may be a patterned photoresist. Trench 92 is formed in etching mask 90.

Next, etching mask 90 is used to etch hard mask layers 88, so that trench 92 extends into hard mask layers 88. The etching may be anisotropic. In accordance with some embodiments, trench 92 extends to the top surface of silicon nitride layer 88A. Etching mask 90 may be removed after trench 92 is formed in hard mask layers 88.

Next, as also shown in FIG. 19, replacement gate stack 70 is etched. The etching of replacement gate stack 70 is anisotropic. In accordance with some embodiments, the etching is performed until STI region 26 is exposed. Trench 92 may or may not extend into STI region 26. After the etching process, hard mask layers 88 may (or may not) be removed. Gate stack 70 is thus separated into gate stacks 70A and 70B.

In a subsequent process, dielectric layer 110 is deposited, as shown in FIG. 20. Dielectric layer 110 may have a multi-layer structure (including dielectric layer 110A and dielectric layer 110B, for example) or may have a single-layer structure. Dielectric layer 110 and the sub layers therein may include SiO, SiN, SiCON, SiCN, SiON, SiCO, or the like.

After the deposition of dielectric layer 110, a planarization process such as a CMP process or a mechanical grinding process is performed. The planarization process may be stopped on the top surfaces of gate stacks 70. The remaining portions of dielectric layers 110A and 110B are collectively referred to as CMG isolation region 110 hereinafter, as shown in FIG. 21. After the process as shown in FIG. 21, the remaining processes as shown in FIGS. 15A, 15B, 16A, and 16B are performed to finish the formation of the GAA transistors 82A and 82B.

The formation of CMG isolation regions 110 by cutting dummy gate stacks 30 is essentially the same as shown in FIGS. 17 through 21, except the dummy gate stacks 30 are etched to form the trenches, and the CMG isolation regions 110 are formed in the corresponding trenches.

FIGS. 22A and 22B through 28A and 28B illustrate the formation of fin isolation regions 112 (using CPODE processes) in accordance with some embodiments. In subsequent figures, the figures having letter A following the corresponding figure numbers are obtained from the Y-cut (along Y-direction) in FIG. 11 or 14, while the figures having letter B following the corresponding figure numbers are obtained from the X-cut (along X-direction) in FIG. 11 or 14.

Figure 22B:
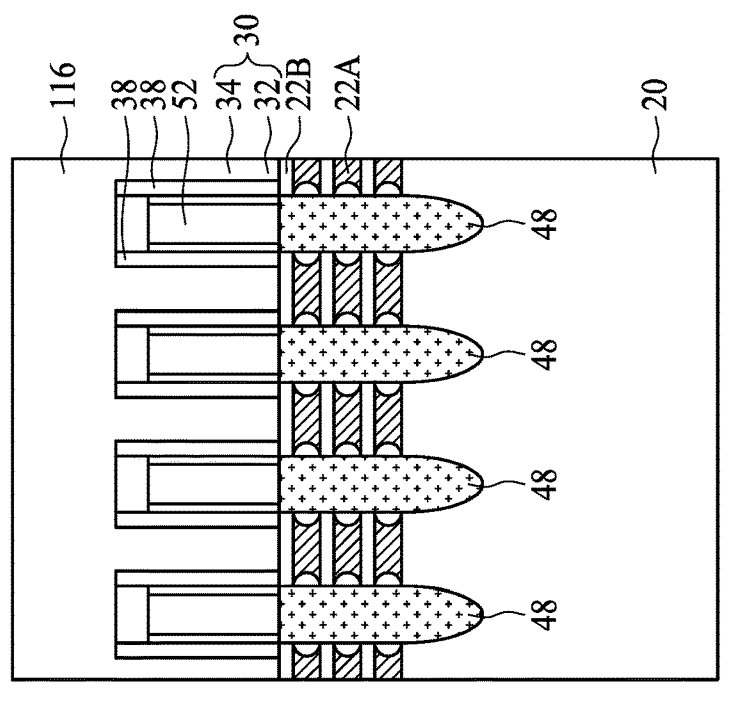
FIGS. 22A, 22B, 23A, 23B, 24A, 24B, 25A, 25B, 26A, 26B, 27A, 27B, 28A, and 28B illustrate the formation of Continuous Polysilicon on Diffusion edge (CPODE) regions by cutting dummy gate stacks in accordance with some embodiments.
Figure 22A:
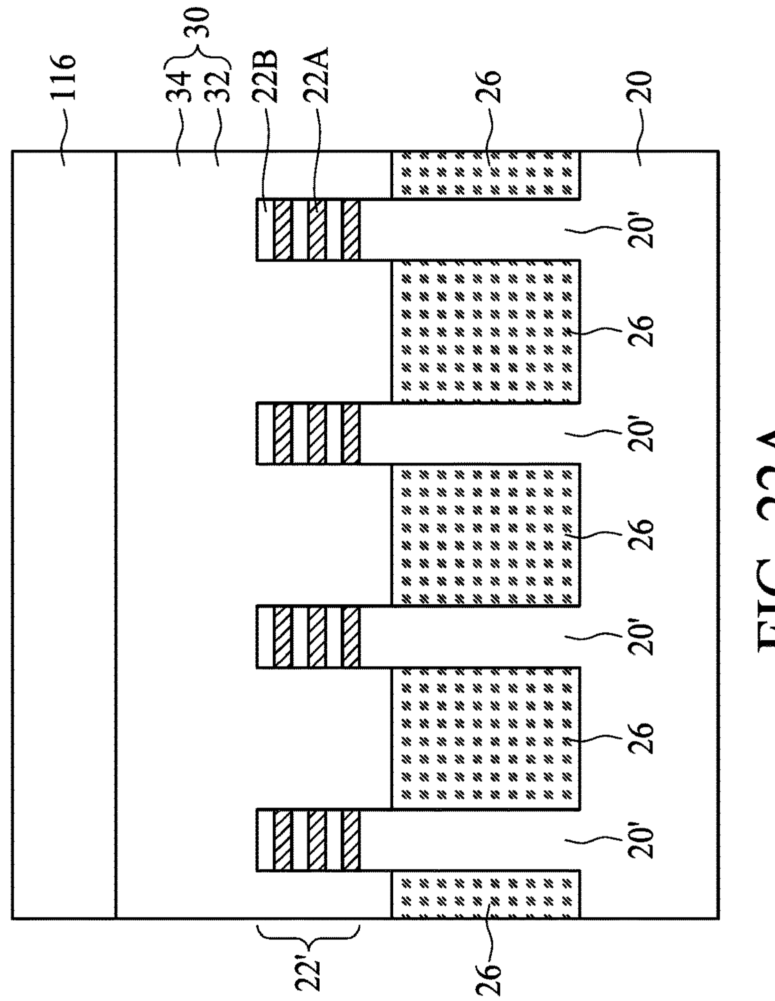

FIGS. 22A and 22B illustrate the structure in FIG. 10C, and are obtained from the cross-sections Y-cut and X-Cut, respectively. FIGS. 22A and 22B also correspond to FIGS. 10A and 10B, respectively. Accordingly, FIG. 22A illustrates multi-layer stacks 22' (also referred to as multilayer stacks 22'), and dummy gate stack 30 on multi-layer stacks 22'. FIG. 22B illustrates source/drain regions 48, multi-layer stacks 22', inner spacers 44, and dummy gate stacks 30.

Figures 23A, 23B:
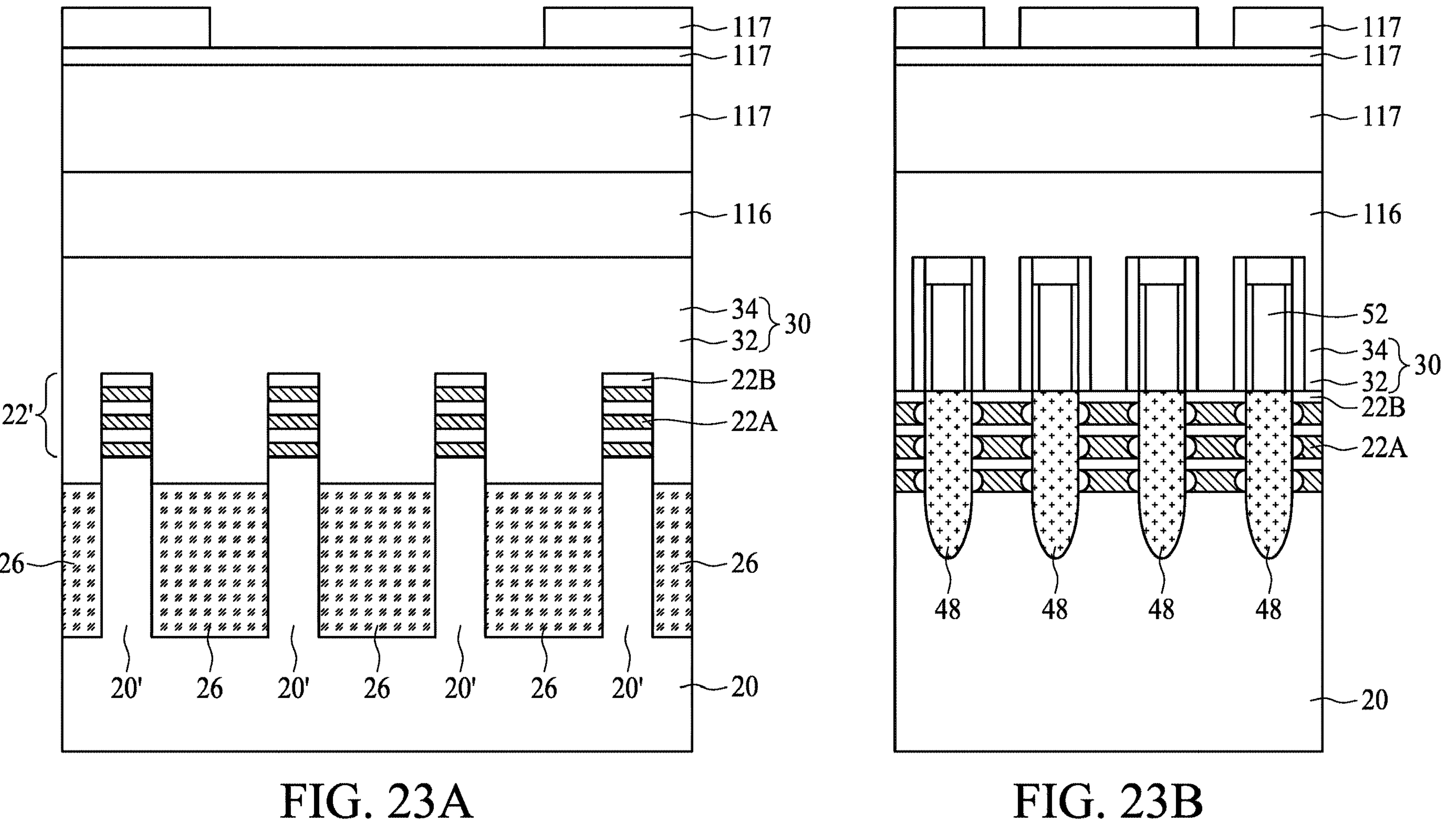
Figures 24A, 24B:
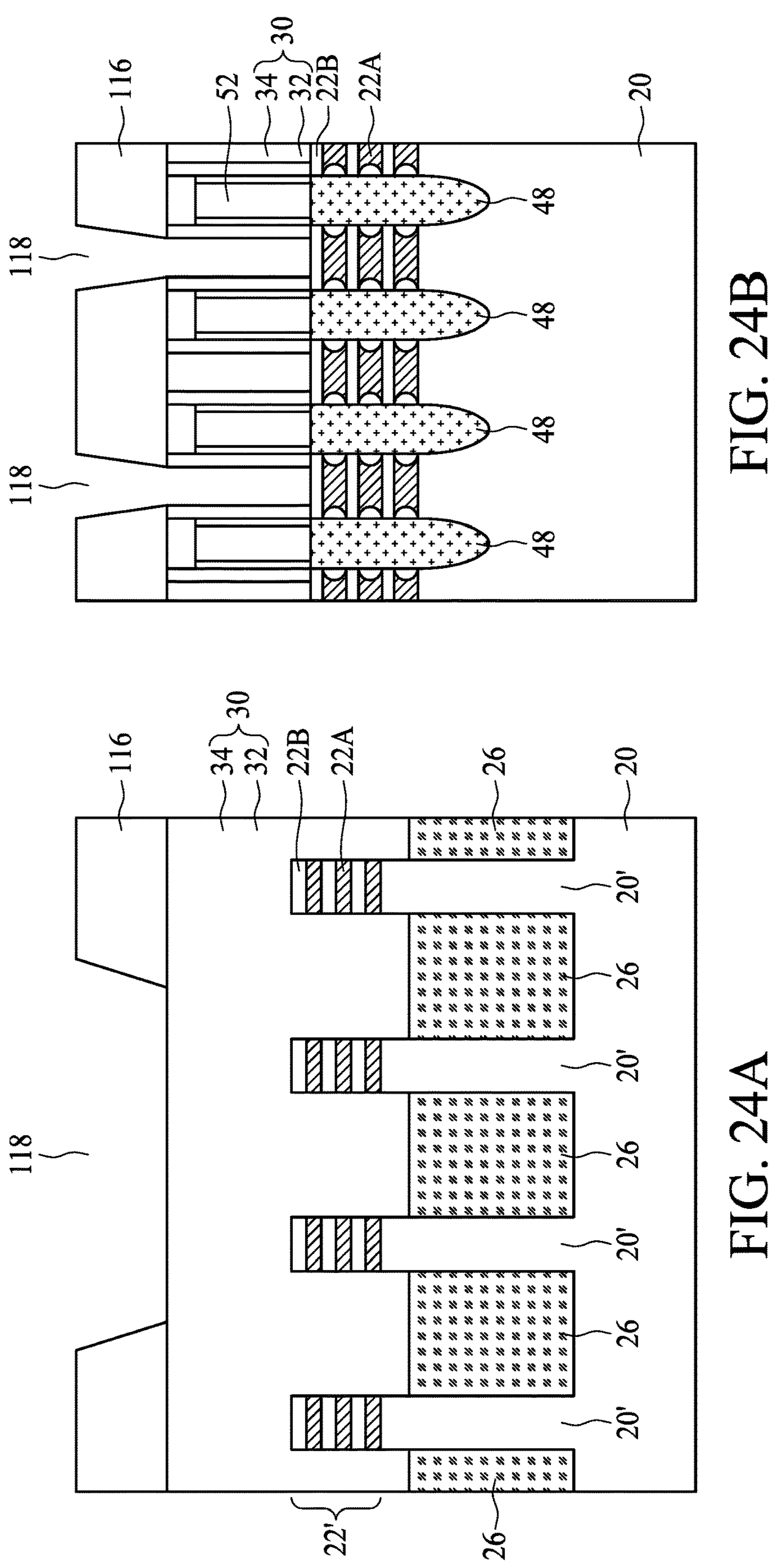
Figures 25A, 25B:
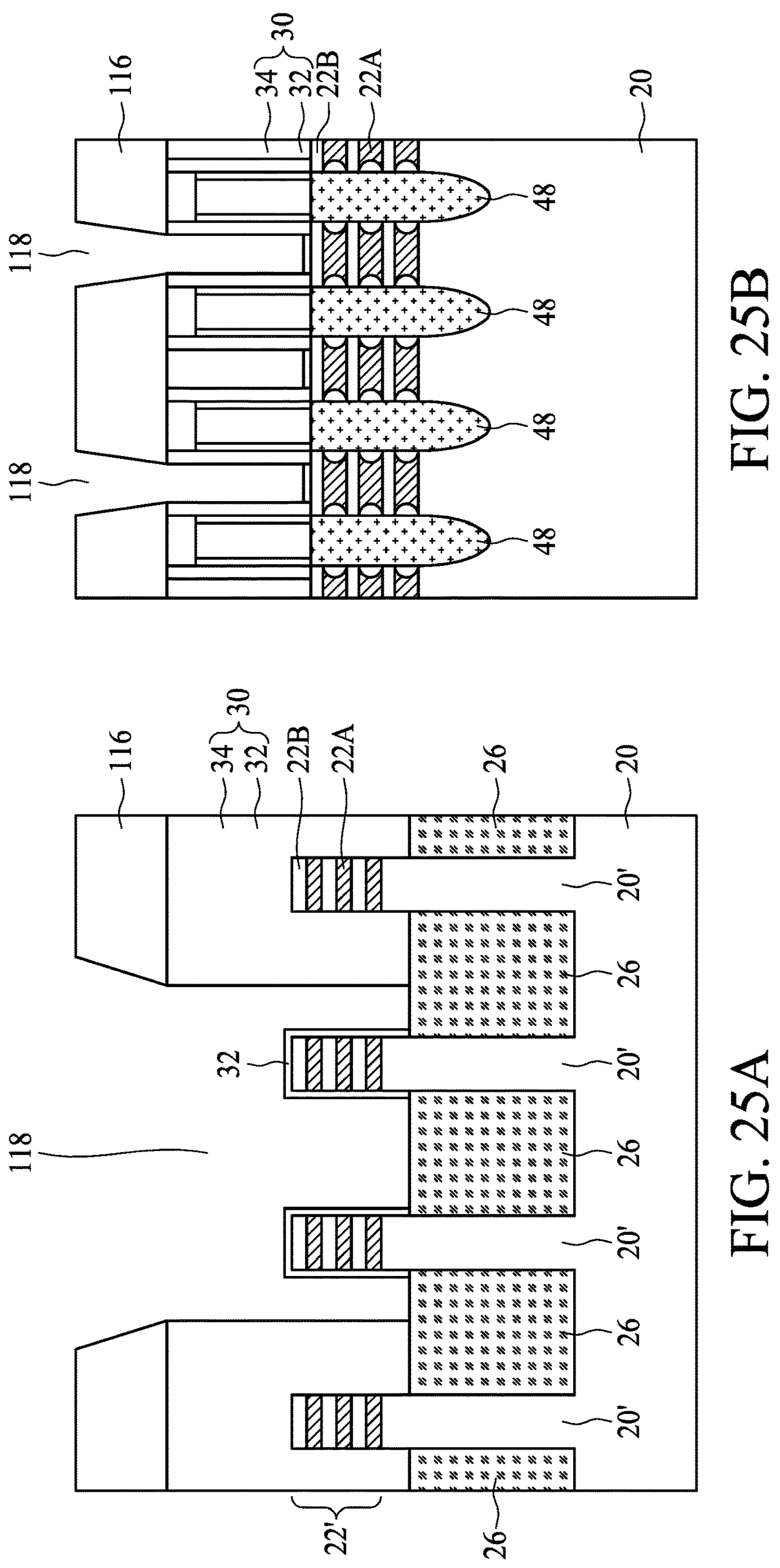

Referring to FIGS. 23A and 23B, hard mask 116 is formed. Hard mask 116 may comprise a dielectric material such as SiN, silicon, or the like, or multi-layers thereof. Etching mask 117, which is patterned, is formed over hard mask 116. Next, as shown in FIGS. 24A and 24B, hard mask 116 is etched to form openings 118, through which dummy gate electrode 34 is exposed. Hard mask 116 is then used to etch-through the underlying dummy gate electrode 34, until dummy gate dielectric 32 is exposed, as shown in FIGS. 25A and 25B. The etching is anisotropic, so that the edges of the dummy gate electrode 34 facing opening 118 are vertical and straight. In the etching process, dummy gate dielectric 32 may be used as an etch stop layer.

Figures 26A, 26B:
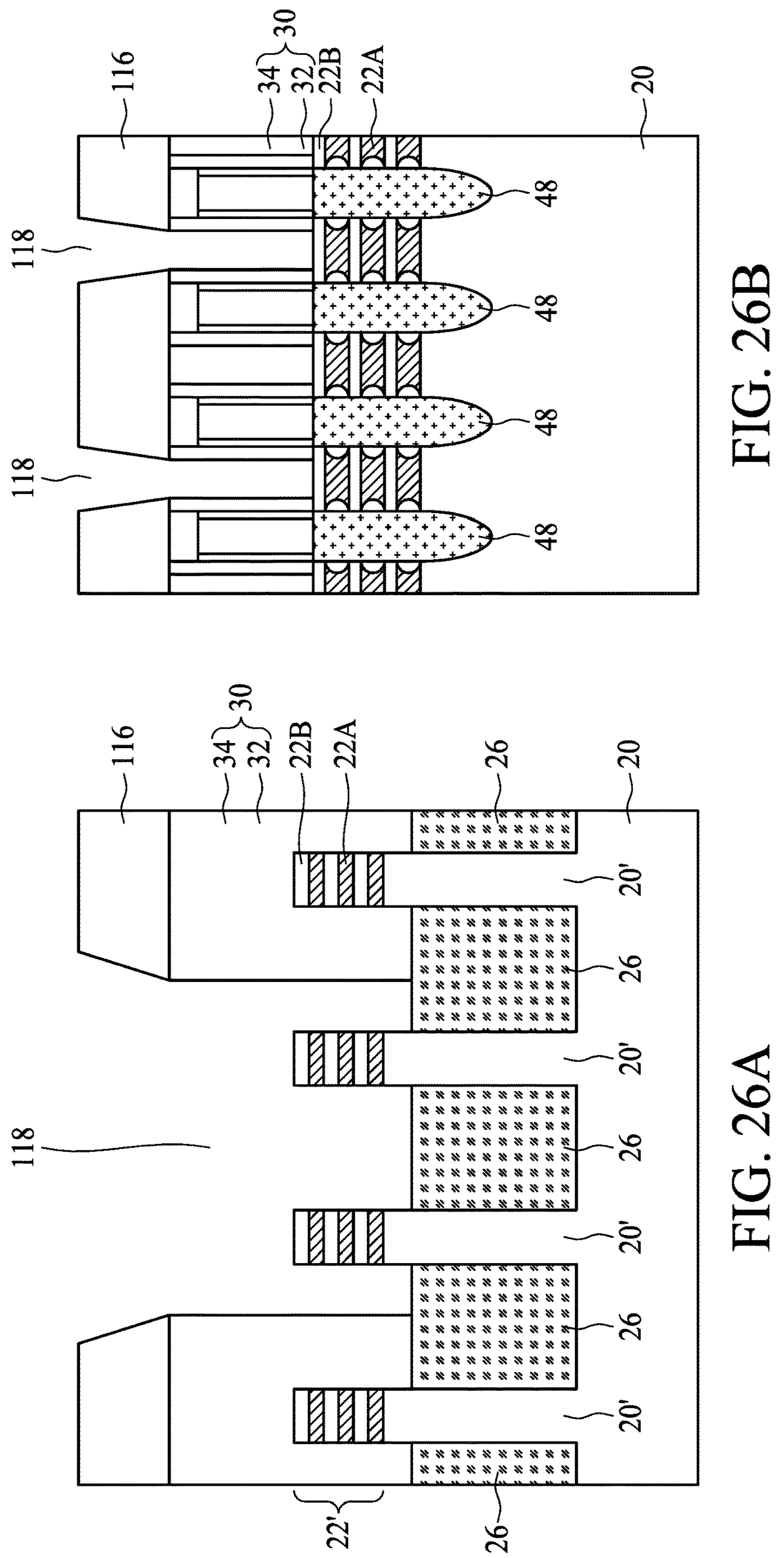
Figures 27A, 27B:
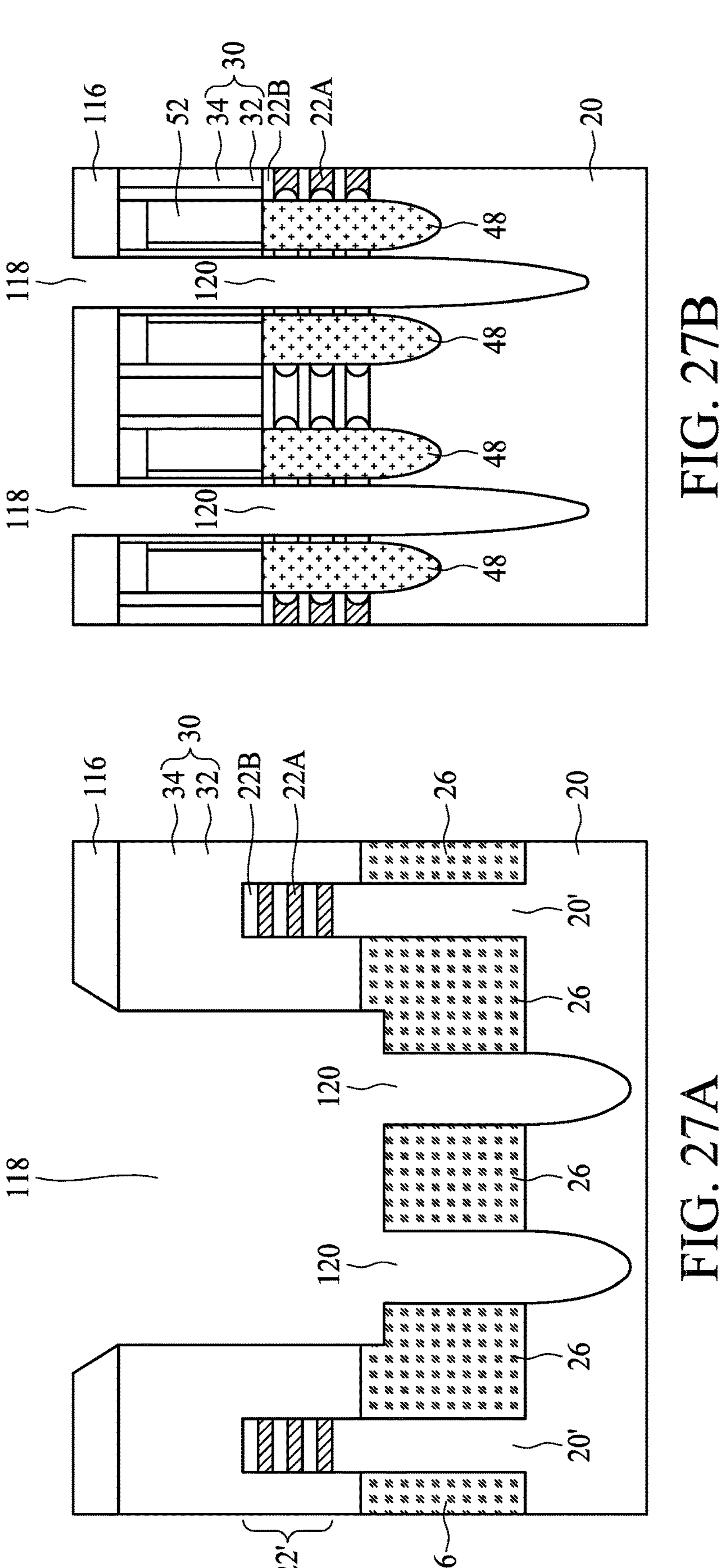

Dummy gate dielectric 32 is then removed, for example, through an isotropic etching process, so that multi-layer stacks 22' are revealed. The resulting structure is shown in FIGS. 26A and 26B. Next, an etching process(es) is performed to remove the exposed multi-layer stacks 22', followed by the further etching of the underlying semiconductor material such as semiconductor strips 20'. Openings 120 are thus formed between neighboring STI regions 26, as shown in FIGS. 27A and 27B. Openings 120 may extend to a level lower than the bottom surfaces of STI regions 26 to reduce leakage.

Figures 28A, 28B:
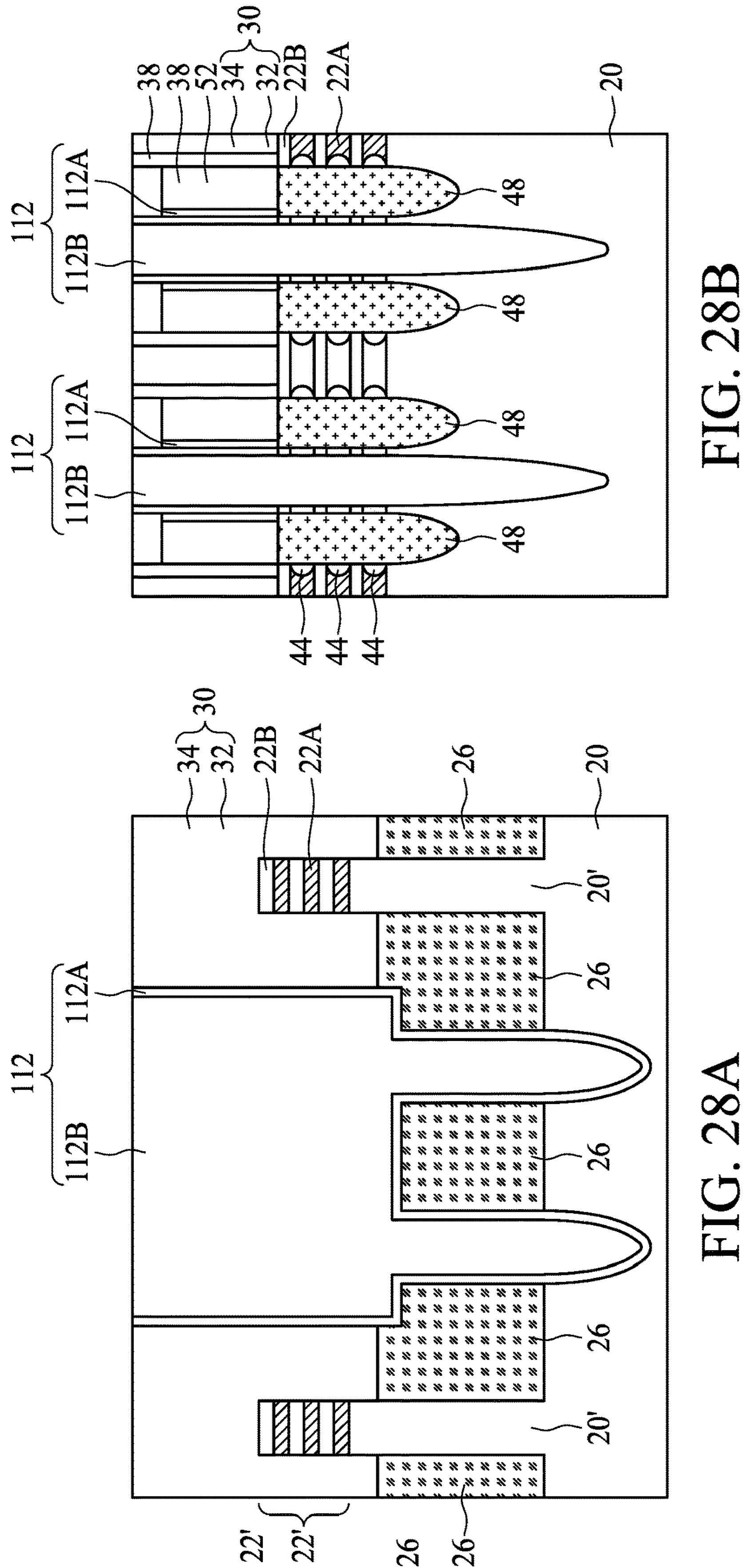

FIGS. 28A and 28B illustrate the filling of openings 118 and 120 to form CPODE isolation region 112. In accordance with some embodiments, the filling process may include depositing a dielectric liner 112A, followed by depositing a dielectric layer 112B on dielectric liner 112A. In accordance with some embodiments, the materials of dielectric liner 112A and dielectric layer 112B may be selected from SiN, SiO, SiON, SiOCN, SiCN, or the like, or combinations thereof. A planarization process such as a CMP process may then be performed to form fin isolation region 112, which is a CPODE isolation region, which is also shown in FIG. 11.

Figures 29A, 29B:
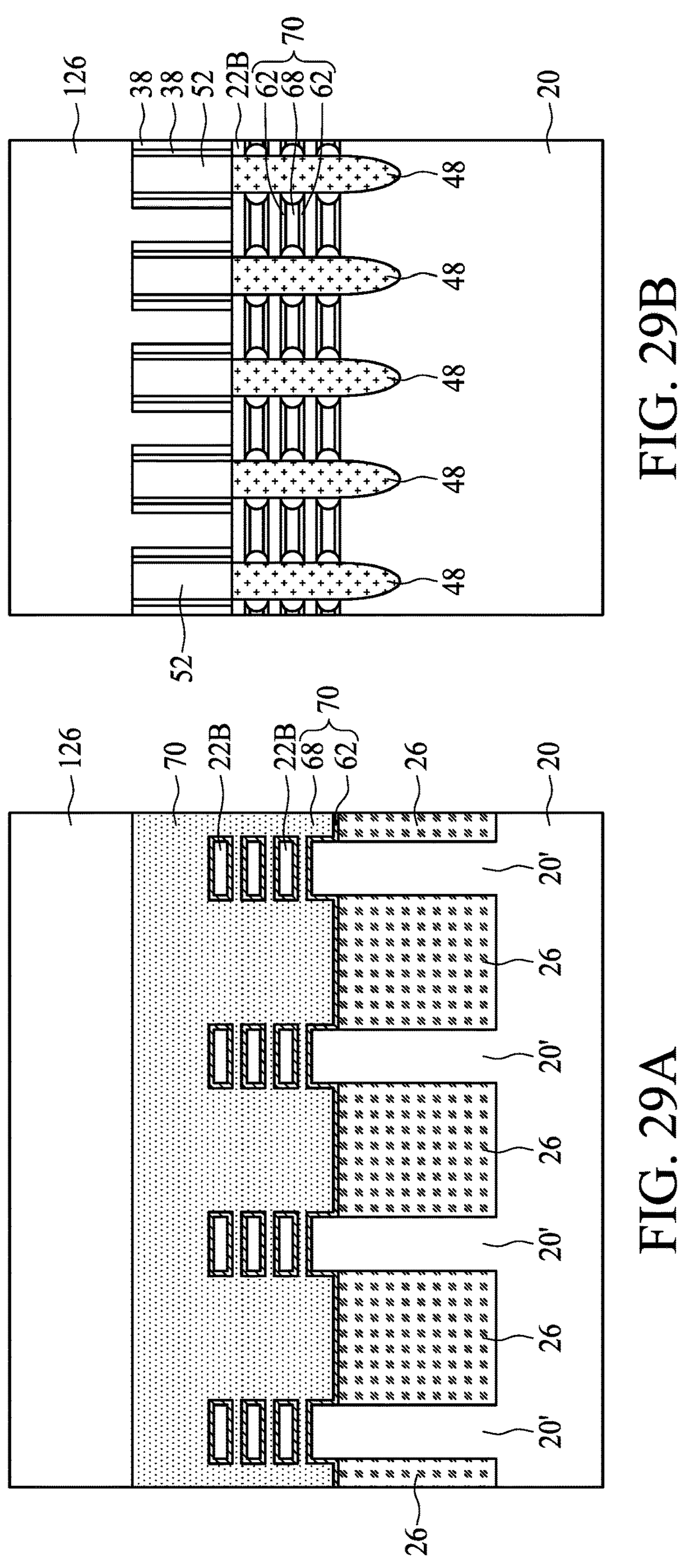
FIGS. 29A, 29B, 30A, 30B, 31A, 31B, 32A, 32B, 33A, and 33B illustrate the formation of Continuous Metal on Diffusion edge (CMODE) isolation regions by cutting replacement gate stacks in accordance with some embodiments.

FIGS. 29A and 29B through 33A and 33B illustrate the formation of fin isolation region 112, which is formed by cutting metal gate stacks 70, and thus the fin isolation region 112 is also a CMODE region. FIGS. 29A and 29B illustrate the structure in FIG. 13C, and are obtained from the cross-sections Y-cut and X-Cut, respectively. FIGS. 29A and 29B also correspond to FIGS. 13A and 13B, respectively. The processes shown in FIGS. 29A and 29B through 33A and 33B are essentially the same as the embodiments shown in FIGS. 22A and 22B through 28A and 28B, except that replacement gate stacks (rather than dummy gate stacks are etched).

FIGS. 29A and 29B illustrate the replacement gate stack 70. Hard mask layer 126 is formed over replacement gate stack 70. Hard mask layer 126 may have a similar structure and similar materials as hard mask layer 88 (FIG. 17). For example, hard mask layers 126 may include a first silicon nitride layer, a silicon layer over the first silicon nitride layer, and a second silicon nitride layer over the silicon layer.

Figure 30B:
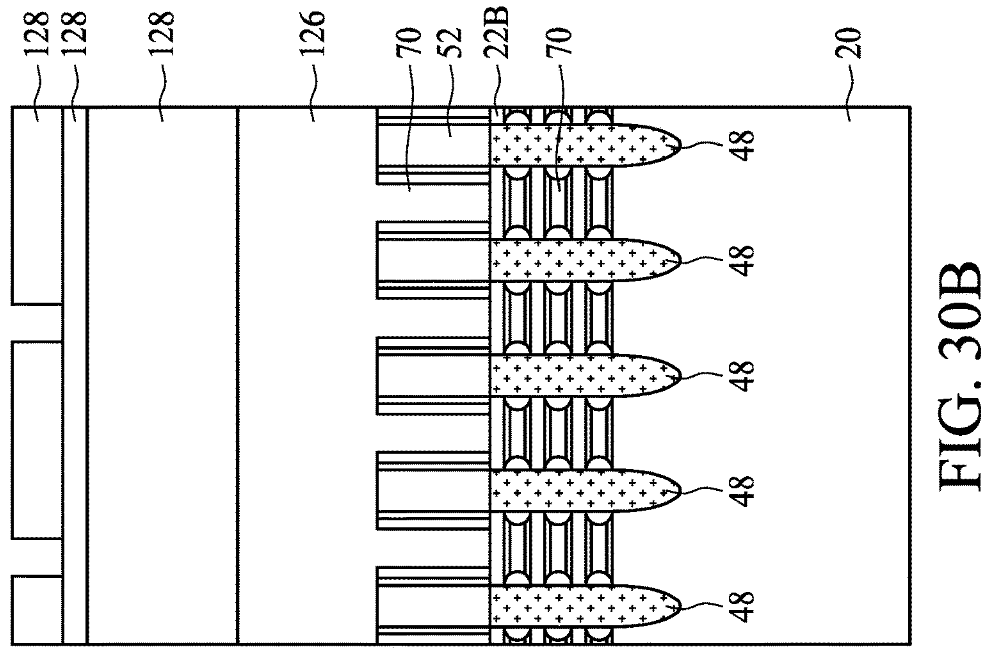
Figure 30A:
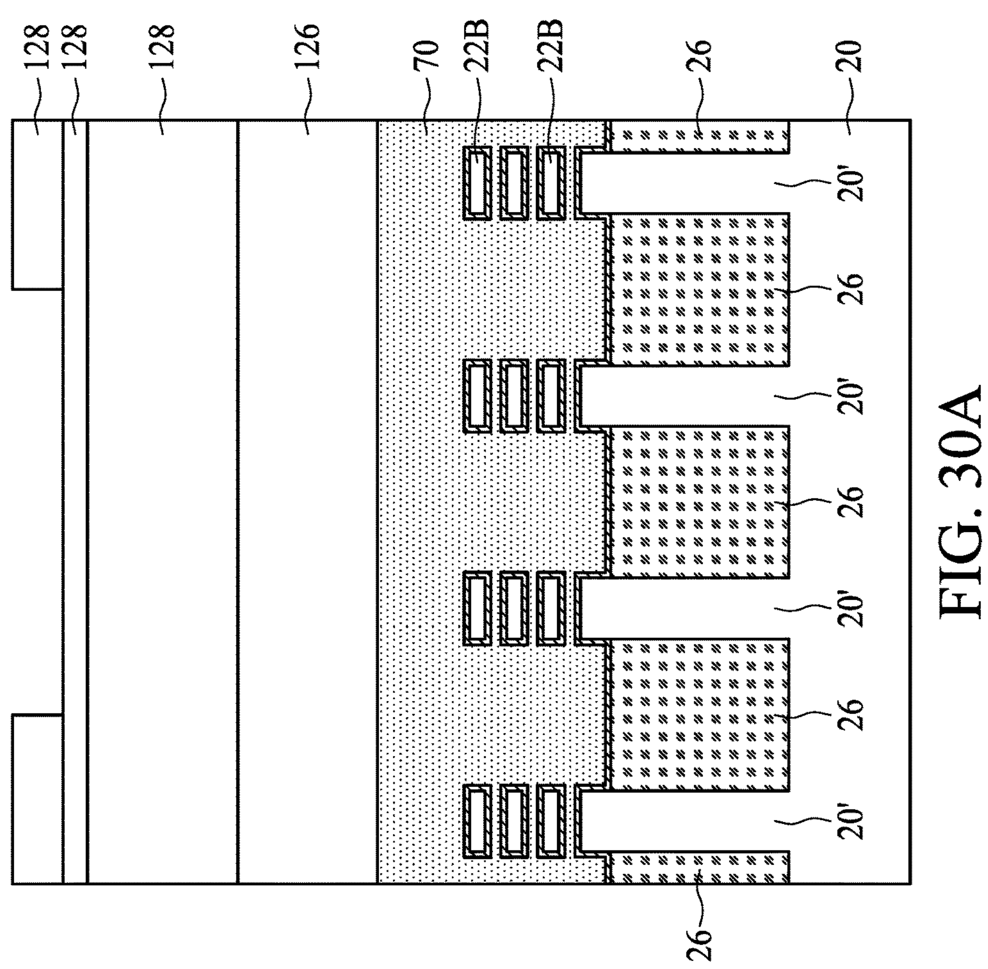

FIGS. 30A and 30B illustrate the formation of etching mask 128, which may be a tri-layer in accordance with some embodiments. For example, the tri-layer may include a carbon-based bottom layer, an oxide-based middle layer, and a patterned photoresist as a top layer.

Figure 31B:
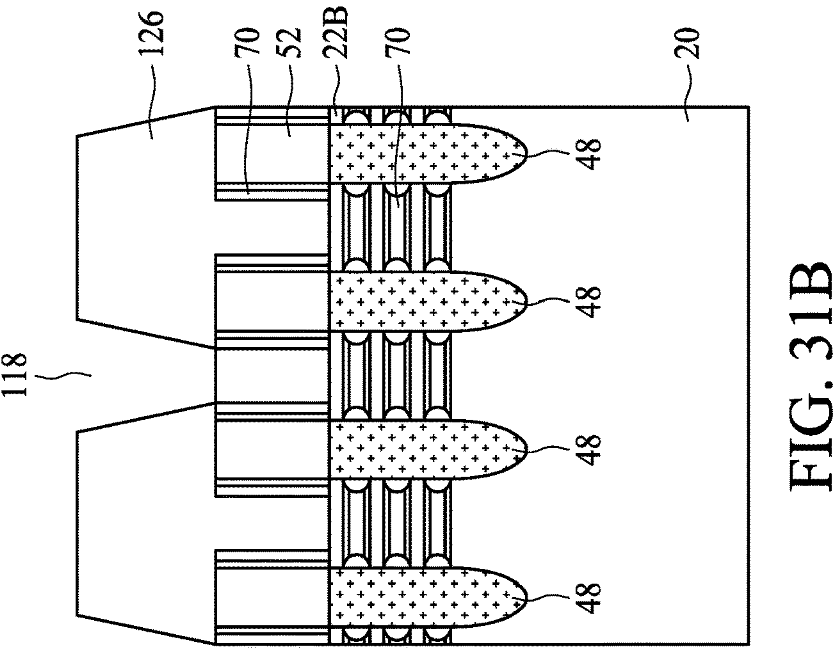
Figure 31A:
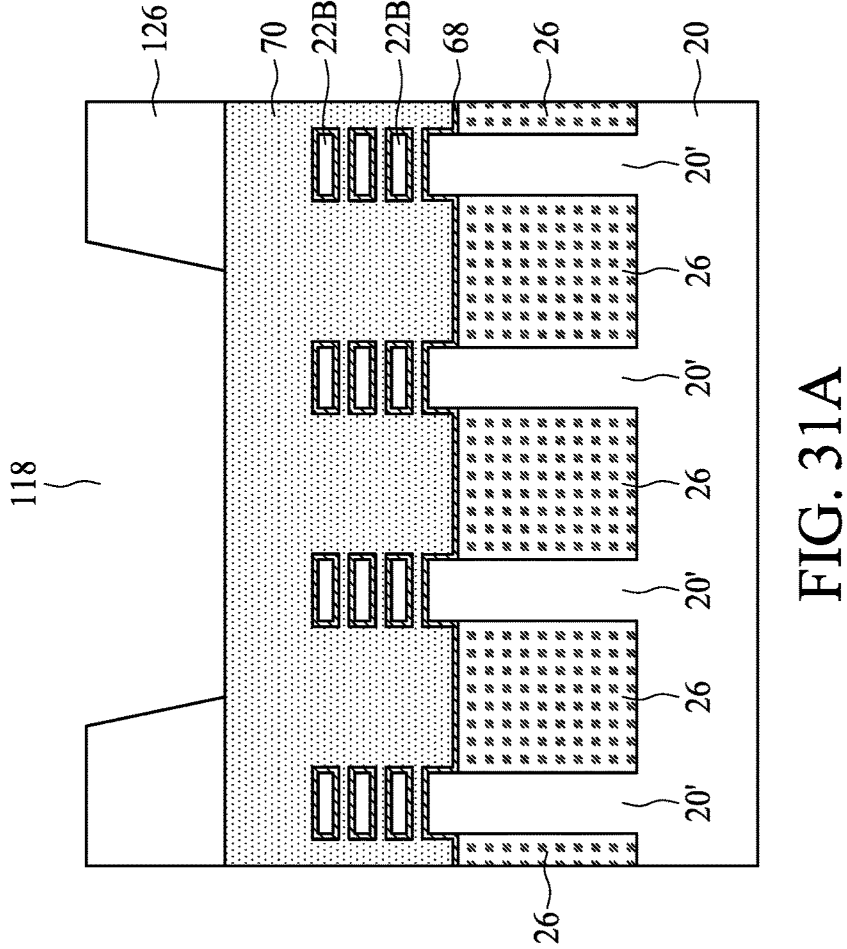
Figure 32B:
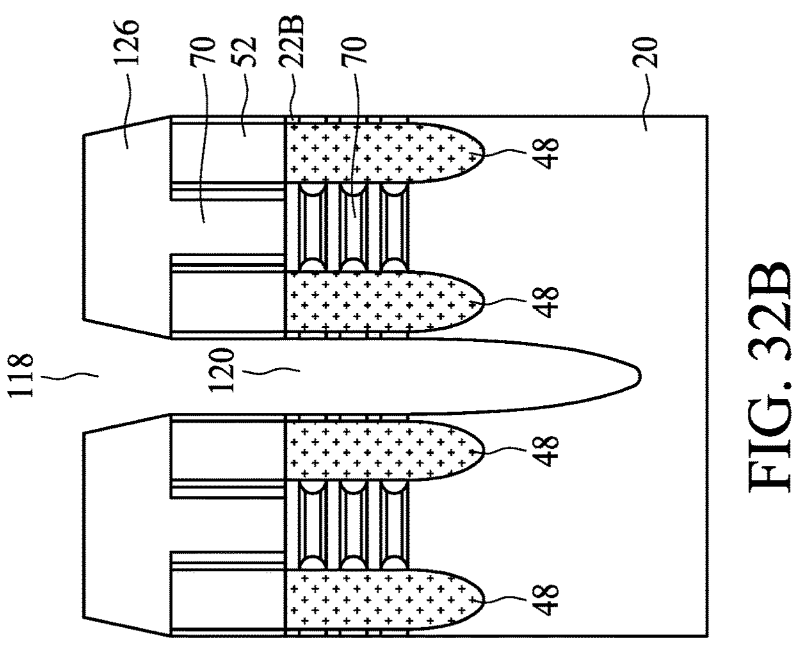
Figure 32A:
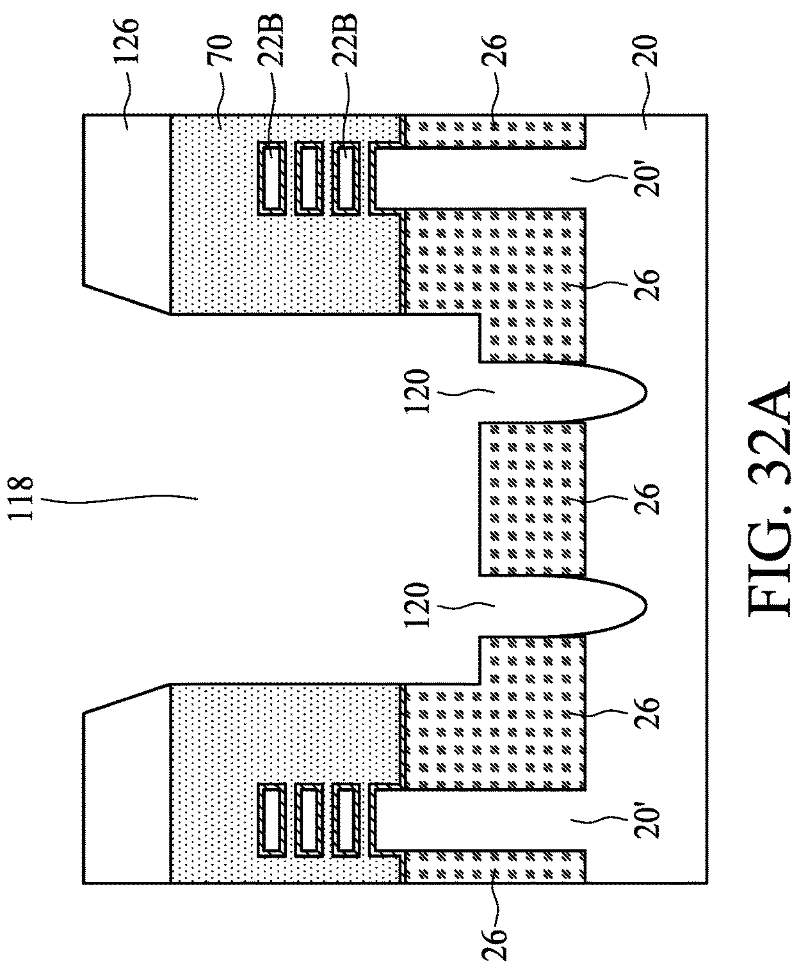

FIGS. 31A and 31B illustrate the formation of openings 118 in hard mask layer 126 through etching. Next, as shown in FIGS. 32A and 32B, replacement gate stack 70 and semiconductor nanostructures 22B are etched in anisotropic etching processes to extend openings 118 into replacement gate stack 70. The portions of semiconductor strips 20' directly underlying openings 118 are then etched, forming openings 120.

Figure 33B:
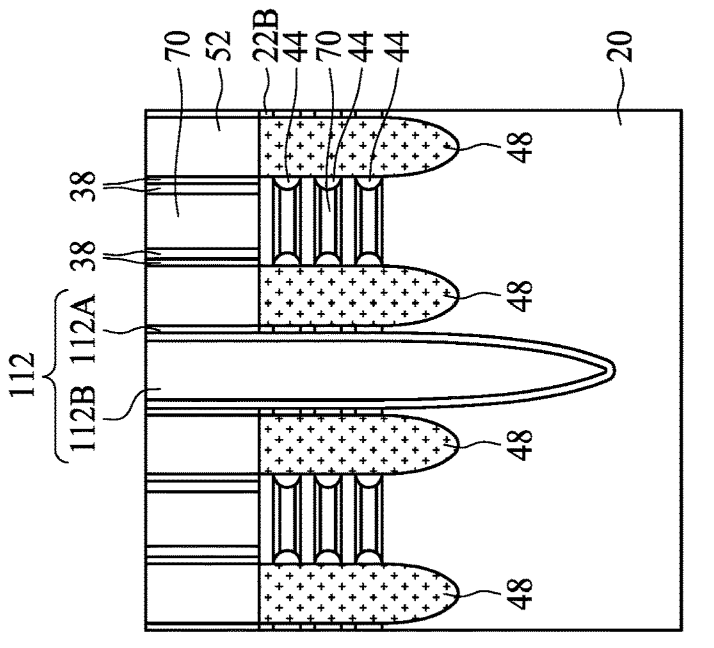
Figure 33A:
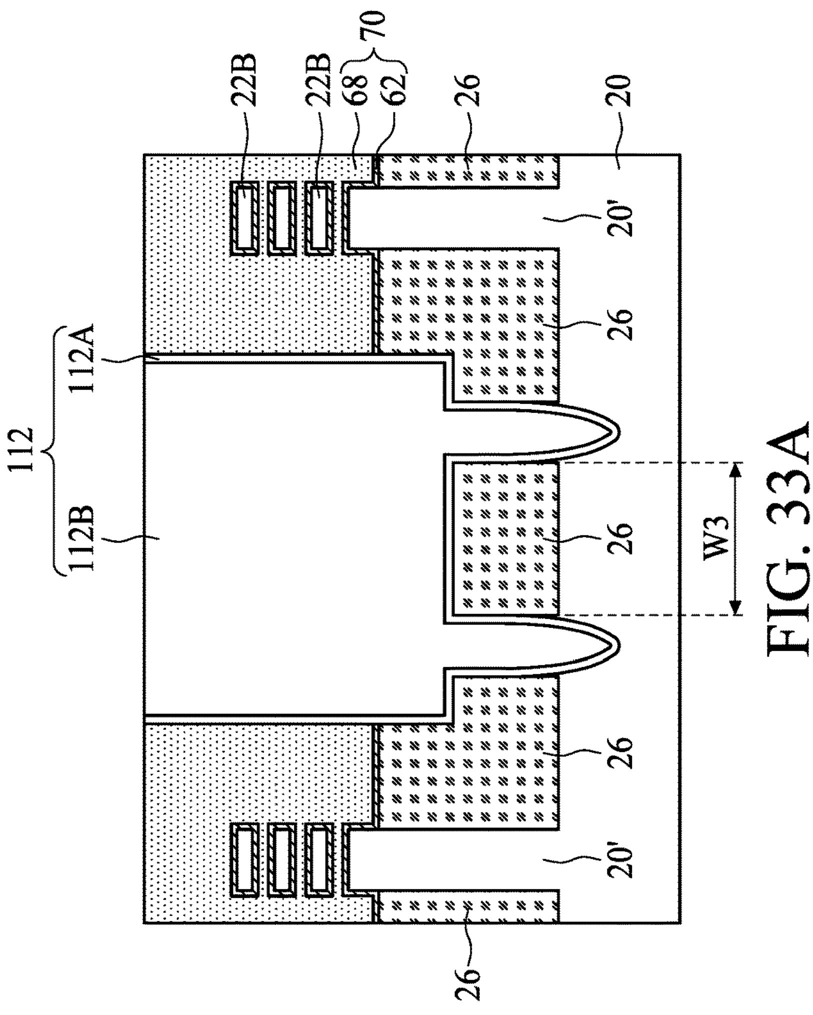

FIGS. 33A and 33B illustrate the filling of openings 118 and 120 to form fin isolation region 112, which is CMODE isolation region. The processes and the materials are essentially the same as that of the region 112 discussed referring to FIGS. 28A and 28B, and are not repeated herein. The fin isolation region 112 is also shown in FIG. 14.

Figure 34:
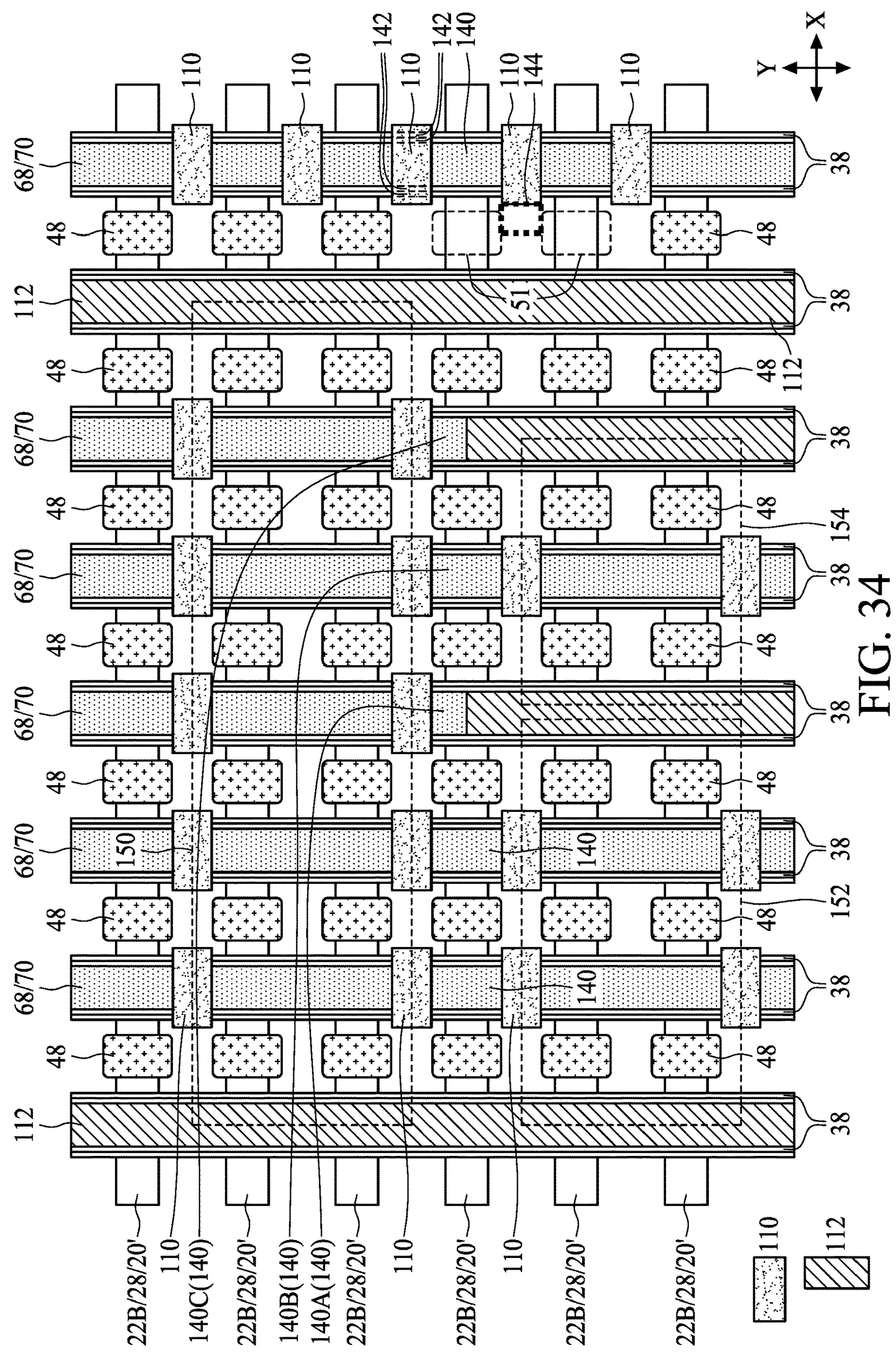
FIG. 34 illustrates a structure including inverters that have different numbers of active gates in accordance with some embodiments.
Figure 35:
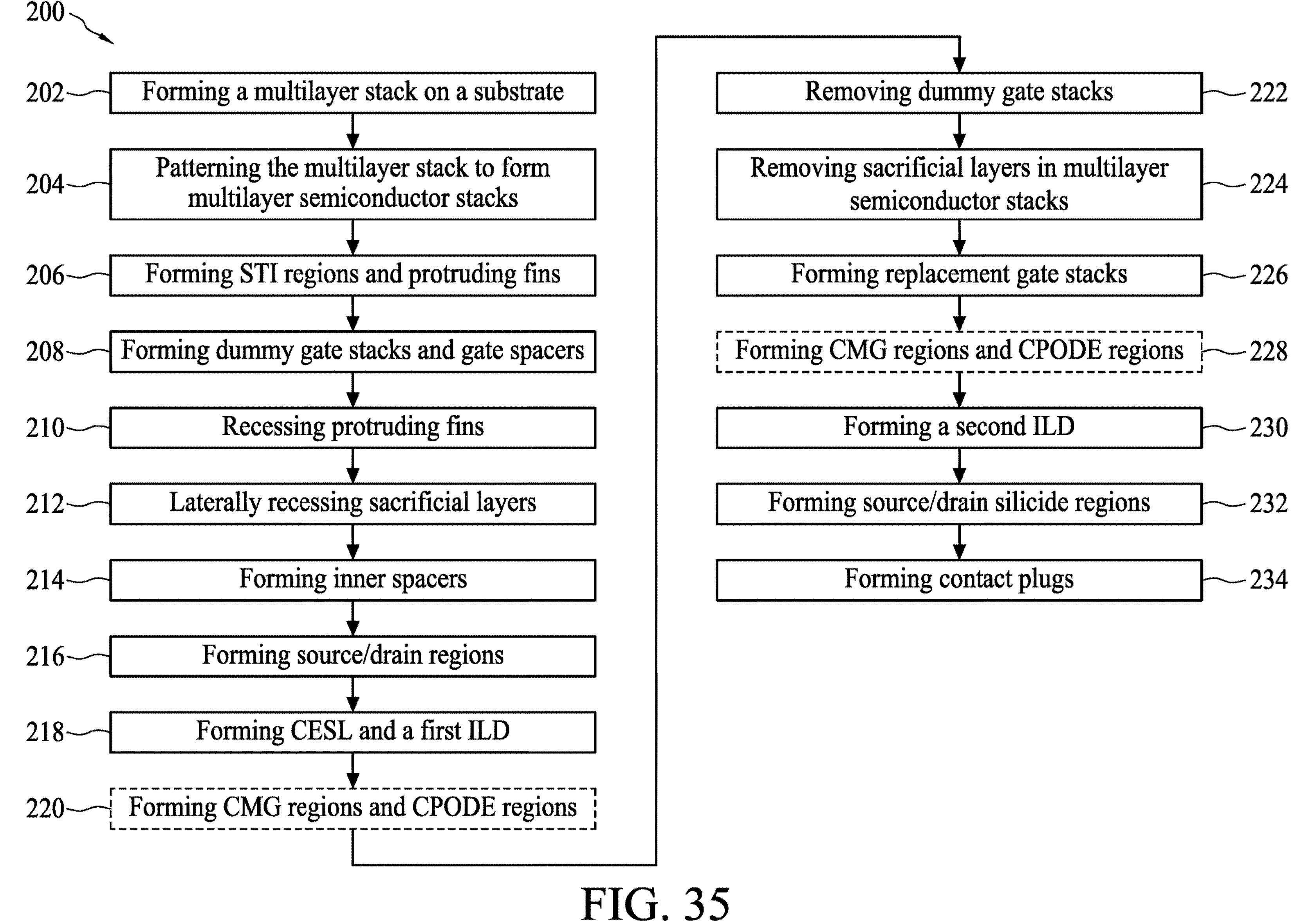
FIG. 35 illustrates a process flow for forming GAA transistors in accordance with some embodiments.

FIG. 34 illustrates a top view of CMG isolation regions 110, fin isolation regions 112, and their relationship with replacement gate stacks 70. It is appreciated that the structures in FIGS. 14 and 34 are examples, and may coexist in the same device die. In accordance with some embodiments, CMG isolation regions 110 are formed as having lengthwise directions parallel to the X-direction, and fin isolation regions 112 are formed as having lengthwise directions parallel to the Y-direction.

Due to the separation of the CMG isolation regions 110 from fin isolation regions 112, there may be some regions separating the CMG isolation regions 110 from their neighboring fin isolation regions 112. For example, FIG. 34 illustrates regions 140 (including regions 140A, 140B, and 140C). Regions 140, although being parts of the long gate stack strips, are not parts of transistors. In accordance with some embodiments, some or all of the regions 140 are formed of the same materials, and are formed in same processes, as replacement gate stacks 70.

In accordance with some embodiments, some or all of the regions 140 are formed of the same materials, and are formed in same processes, as dummy gate stacks 30, which are not replaced. In accordance with yet alternative embodiments, in the final structure after transistors have been formed, some regions 140 are formed of the same materials, and are formed in same processes as, dummy gate stacks 30, while some other regions 140 are formed of the same materials, and are formed in same processes as, replacement gate stacks 70.

In accordance with some embodiments, each of the regions 140 may be electrically floating or electrically grounded, depending on the process and performance requirement of the circuit. In accordance with some embodiments, some of the regions 140 are electrically grounded, while other regions 140 are electrically floating, or alternatively, all of the regions 140 are electrically grounded or electrically floating.

The lengths of CMG isolation regions 110 may be selected depending on the layout of the circuit. In accordance with some embodiments, in the formation of some CMG isolation regions 110, the gate spacers 38 on opposite sides of the respective gate stacks 70 (or dummy gate stacks 30) are also etched, and hence CMG isolation regions 110 laterally extend (in the X-direction) beyond spacers 38. In accordance with alternative embodiments, some or all of CMG isolation regions 110 are limited by the opposing gate spacers 38. For example, as shown in FIG. 34, dashed lines 142 represent that the gate spacers 38 may have opposite ends (the left and/or right ends) contacting gate spacers 38. Some of CMG isolation regions 110 may cut into gate spacers 38, and may extend laterally beyond gate spacers 38 into the neighboring ILD regions.

The lengths of CMG isolation regions 110 may also extend longer than illustrated. For example, in FIG. 34, assuming that there are no source/drain regions formed in the regions represented by dashed lines 51, the nearby CMG isolation region 110 may extend further left to the position represented by dashed line 144.

In accordance with some embodiments, CMG isolation regions 110 are fully spaced apart from fin isolation regions 112, and no CMG isolation region 110 physically join any of the fin isolation regions 112 throughout the respective device die and wafer. The CMG isolation region 110 will also be spaced apart, and will not contact, source/drain regions 48. Keeping CMG isolation regions 110 separated from fin isolation regions 112 is advantageous since this will reduce the interaction between the formation processes of CMG isolation regions 110 and fin isolation regions 112. For example, in FIG. 14, if a long CMG isolation region is formed and includes CMG isolation regions 110-1 and 110-2 and a portion in dashed frame 110-3, the CMG isolation region will cross a fin isolation region 112 in the dashed frame 110-3. As shown in FIG. 33A, an STI region 26 is directly underlying the fin isolation region 112. The CMG isolation region 110 will cut into the fin isolation region 112, damaging the underlying STI region 26 and adversely forming a deep recess therein.

In accordance with some embodiments, as shown in FIGS. 14 and 34, replacement gate stacks 70 are formed as long strips extending in the Y-direction. CMG isolation region 110 may be formed on some of the replacement gate stacks 70, while fin isolation regions 112 are formed on their neighboring replacement gate stacks 70. The formation of CMG isolation region 110 and fin isolation region 112 electrically isolation transistors to form functional circuits. For example, FIG. 34 illustrates an inverter 150 including four active gates. There may also be inverter 152 with two active gates, and inverter 154 with a single active gate.

In accordance with some embodiments, the width W1 (FIG. 14) of replacement gate stacks 70 may be in the range between about 5 nm and about 15 nm. The width W2 of CMG isolation region 112 may be close to the width W3 (FIG. 33A) of STI regions 26, which may be in the range between about 30 nm and about 50 nm in accordance with some embodiments.

The embodiments of the present disclosure have some advantageous features. By forming CMG isolation regions spaced apart from and not intersecting fin isolation regions (CPODE and/or CMODE isolation regions), the adverse effect such as the damage to epitaxy regions, metals, and semiconductor nanostructures is eliminated. Also, it is easy to space the short CMG isolation regions apart from nearby epitaxy regions, and there is also no need to reduce the width of CMG isolation regions in order to pass between neighboring epitaxy regions. This advantageously eliminate the possibility of increasing the parasitic capacitance and the difficulty in the formation process due to the formation of narrow CMG isolation regions.

In accordance with some embodiments of the present disclosure, a method comprises forming a plurality of semiconductor regions having first lengthwise directions parallel to a first direction; forming a plurality of gate stacks having second lengthwise directions parallel to a second direction perpendicular to the first direction, wherein the plurality of gate stacks are on first portions of the plurality of semiconductor regions; etching the plurality of gate stacks to form a first plurality of openings, wherein the first plurality of openings separate the plurality of gate stacks into first shorter portions; filling the first plurality of openings to form gate isolation regions; etching the plurality of semiconductor regions to form a second plurality of openings, wherein the second plurality of openings separate the plurality of semiconductor regions into second shorter portions; and filling the second plurality of openings to form fin isolation regions, wherein the gate isolation regions are spaced apart from the fin isolation regions.

In an embodiment, the gate isolation regions and the fin isolation regions are in a device die, and wherein all of the gate isolation regions in the device die are spaced apart from all of the fin isolation regions in the device die. In an embodiment, the etching the plurality of gate stacks comprises etching a plurality of dummy gate stacks, and the method further comprises, after the gate isolation regions are formed, replacing the first shorter portions of the dummy gate stacks with replacement gate stacks. In an embodiment, the etching the plurality of gate stacks comprises etching a plurality of replacement gate stacks. In an embodiment, when the plurality of gate stacks are etched, gate spacers on sidewalls of the plurality of gate stacks are also etched.

In an embodiment, the method further comprises forming a plurality of source/drain regions based on second portions of the plurality of semiconductor regions, wherein the gate isolation regions are physically separated from nearest source/drain regions. In an embodiment, in a top view of the plurality of semiconductor regions and the plurality of gate stacks, a gate isolation region of the gate isolation regions is between a first semiconductor region and a second semiconductor region of the plurality of semiconductor regions.

In an embodiment, the second plurality of openings have bottoms lower than dielectric isolation regions that are on opposite sides of the second plurality of openings. In an embodiment, the etching the plurality of semiconductor regions comprises etching semiconductor nanostructures and semiconductor strips underlying the semiconductor nanostructures.

In accordance with some embodiments of the present disclosure, a structure comprises a plurality of semiconductor regions; a gate stack comprising a plurality of portions aligned to a straight line; a plurality of gate isolation regions having lengthwise directions in a first direction; a plurality of fin isolation regions having lengthwise directions in a second direction perpendicular to the first direction, wherein the plurality of fin isolation regions and the separate the plurality of portions of the gate stack from each other, and separate some of the plurality of semiconductor regions into shorter portions; and a plurality of source/drain regions on opposing sides of the gate stack, wherein the plurality of gate isolation regions are physically separated from the plurality of fin isolation regions, and are physically separated from the plurality of source/drain regions.

In an embodiment, the plurality of semiconductor regions comprise semiconductor nanostructures. In an embodiment, the plurality of semiconductor regions comprise semiconductor fins. In an embodiment, the semiconductor regions are in a device die, and wherein in the device die, all of gate isolation regions are spaced apart from all of fin isolation regions. In an embodiment, the structure comprises a first gate spacer and a second gate spacer on opposing sidewalls of the gate stack, wherein one of the gate isolation regions is between the first gate spacer and the second gate spacer. In an embodiment, the plurality of portions of the gate stack comprise metal gates. In an embodiment, the plurality of portions of the gate stack comprise gate dielectrics separating respective gate electrodes from the plurality of fin isolation regions.

In accordance with some embodiments of the present disclosure, a structure comprises a semiconductor substrate; a plurality of shallow trench isolation regions over a bulk portion of the semiconductor substrate; a plurality of transistors comprising: a plurality of nanostructures, with upper ones of the plurality of nanostructures overlapping respective lower ones of the plurality of nanostructures; a plurality of gate stacks on the plurality of nanostructures, wherein the plurality of gate stacks comprise first portions between the plurality of nanostructures; a plurality of gate isolation regions separating the plurality of gate stacks from each other, wherein the plurality of gate isolation regions have bottoms contacting top surfaces of the plurality of shallow trench isolation regions; and a plurality of fin isolation regions separating the plurality of nanostructures from each other, wherein the plurality of fin isolation regions comprise second portions between the plurality of shallow trench isolation regions, with bottoms of the plurality of fin isolation regions being lower than the shallow trench isolation regions, and wherein the plurality of fin isolation regions are physically spaced apart from the plurality of gate isolation regions.

In an embodiment, the plurality of gate isolation regions are separated from all source/drain regions of the plurality of transistors. In an embodiment, the plurality of transistors further comprise two gate spacers on opposing sidewalls of one of the plurality of gat stacks, wherein one of the gate isolation regions forms interfaces with the two gate spacers, and the interfaces are parallel to lengthwise directions of the plurality of gat stacks. In an embodiment, the plurality of transistors further comprise two gate spacers on opposing sidewalls of one of the plurality of gat stacks, wherein one of the gate isolation regions separate one of the two gate spacers into two portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming a plurality of semiconductor regions having first lengthwise directions parallel to a first direction;
- forming a plurality of gate stacks having second lengthwise directions parallel to a second direction perpendicular to the first direction, wherein the plurality of gate stacks are on first portions of the plurality of semiconductor regions;
- etching the plurality of gate stacks to form a first plurality of openings, wherein the first plurality of openings separate the plurality of gate stacks into first shorter portions;
- filling the first plurality of openings to form gate isolation regions;
- etching the plurality of semiconductor regions to form a second plurality of openings, wherein the second plurality of openings separate the plurality of semiconductor regions into second shorter portions; and
- filling the second plurality of openings to form fin isolation regions, wherein the gate isolation regions are spaced apart from the fin isolation regions.

2. The method of claim 1, wherein the gate isolation regions and the fin isolation regions are in a device die, and wherein all of the gate isolation regions in the device die are spaced apart from all of the fin isolation regions in the device die.

3. The method of claim 1, wherein the etching the plurality of gate stacks comprises etching a plurality of dummy gate stacks, and the method further comprises, after the gate isolation regions are formed, replacing the first shorter portions of the dummy gate stacks with replacement gate stacks.

4. The method of claim 1, wherein the etching the plurality of gate stacks comprises etching a plurality of replacement gate stacks.

5. The method of claim 1, wherein when the plurality of gate stacks are etched, gate spacers on sidewalls of the plurality of gate stacks are also etched.

6. The method of claim 1 further comprising forming a plurality of source/drain regions based on second portions of the plurality of semiconductor regions, wherein the gate isolation regions are physically separated from nearest source/drain regions.

7. The method of claim 1, wherein in a top view of the plurality of semiconductor regions and the plurality of gate stacks, a gate isolation region of the gate isolation regions is between a first semiconductor region and a second semiconductor region of the plurality of semiconductor regions.

8. The method of claim 1, wherein the second plurality of openings have bottoms lower than dielectric isolation regions that are on opposite sides of the second plurality of openings.

9. The method of claim 1, wherein the etching the plurality of semiconductor regions comprises etching semiconductor nanostructures and semiconductor strips underlying the semiconductor nanostructures.

10. A structure comprising:

a plurality of semiconductor regions;

a gate stack comprising a plurality of portions aligned to a straight line;

a plurality of gate isolation regions having lengthwise directions in a first direction;

a plurality of fin isolation regions having lengthwise directions in a second direction perpendicular to the first direction, wherein the plurality of fin isolation regions separate the plurality of portions of the gate stack from each other, and separate some of the plurality of semiconductor regions into shorter portions; and a plurality of source/drain regions on opposing sides of the gate stack, wherein the plurality of gate isolation regions are physically separated from the plurality of fin isolation regions, and are physically separated from the plurality of source/drain regions.

11. The structure of claim 10, wherein the plurality of semiconductor regions comprise semiconductor nanostructures.

12. The structure of claim 10, wherein the plurality of semiconductor regions comprise semiconductor fins.

13. The structure of claim 10, wherein the semiconductor regions are in a device die, and wherein in the device die, all of gate isolation regions are spaced apart from all of fin isolation regions.

14. The structure of claim 10 further comprising a first gate spacer and a second gate spacer on opposing sidewalls of the gate stack, wherein one of the gate isolation regions is between the first gate spacer and the second gate spacer.

15. The structure of claim 10, wherein the plurality of portions of the gate stack comprise metal gates.

16. The structure of claim 10, wherein the plurality of portions of the gate stack comprise gate dielectrics separating respective gate electrodes from the plurality of fin isolation regions.

17. A structure comprising:

a semiconductor substrate;

a plurality of shallow trench isolation regions over a bulk portion of the semiconductor substrate;

a plurality of transistors comprising:

a plurality of nanostructures, with upper ones of the plurality of nanostructures overlapping respective lower ones of the plurality of nanostructures;

a plurality of gate stacks on the plurality of nanostructures, wherein the plurality of gate stacks comprise first portions between the plurality of nanostructures;

a plurality of gate isolation regions separating the plurality of gate stacks from each other, wherein the plurality of gate isolation regions have bottoms contacting top surfaces of the plurality of shallow trench isolation regions; and a plurality of fin isolation regions separating the plurality of nanostructures from each other, wherein the plurality of fin isolation regions comprise second portions between the plurality of shallow trench isolation regions, with bottoms of the plurality of fin isolation regions being lower than the shallow trench isolation regions, and wherein the plurality of fin isolation regions are physically spaced apart from the plurality of gate isolation regions.

18. The structure of claim 17, wherein the plurality of gate isolation regions are separated from all source/drain regions of the plurality of transistors.

19. The structure of claim 17, wherein the plurality of transistors further comprise two gate spacers on opposing sidewalls of one of the plurality of gate stacks, wherein one of the gate isolation regions forms interfaces with the two gate spacers, and the interfaces are parallel to lengthwise directions of the plurality of gate stacks.

20. The structure of claim 17, wherein the plurality of transistors further comprise two gate spacers on opposing sidewalls of one of the plurality of gate stacks, wherein one of the gate isolation regions separate one of the two gate spacers into two portions.

* * * * *